(12) United States Patent
Hua et al.

(10) Patent No.: US 11,985,752 B2
(45) Date of Patent: May 14, 2024

(54) INDUCTOR ASSEMBLY, IMPEDANCE MATCHING NETWORK AND SYSTEM INCLUDING INDUCTOR ASSEMBLY

(71) Applicant: NXP USA, Inc., Austin, TX (US)

(72) Inventors: Qi Hua, Wu Xi (CN); Tonghe Liu, Pudong new district (CN); Changyang Wang, Shanghai (CN)

(73) Assignee: NXP USA, Inc., Austin, TX (US)

(*) Notice: Subject to any disclaimer, the term of this patent is extended or adjusted under 35 U.S.C. 154(b) by 919 days.

(21) Appl. No.: 17/008,259

(22) Filed: Aug. 31, 2020

(65) Prior Publication Data
US 2021/0368591 A1 Nov. 25, 2021

(30) Foreign Application Priority Data
May 22, 2020 (CN) .......................... 202010439255.3

(51) Int. Cl.
| *H05B 6/50* | (2006.01) |
| *H01F 27/24* | (2006.01) |
| *H01F 27/28* | (2006.01) |
| *H03H 7/38* | (2006.01) |
| *H05B 6/54* | (2006.01) |
| *H05B 6/62* | (2006.01) |

(52) U.S. Cl.
CPC .............. *H05B 6/50* (2013.01); *H01F 27/24* (2013.01); *H01F 27/28* (2013.01); *H03H 7/38* (2013.01); *H05B 6/54* (2013.01); *H05B 6/62* (2013.01)

(58) Field of Classification Search
CPC ........ H01F 27/006; H01F 27/24; H01F 27/28; H01F 5/02; H03H 7/38; H05B 6/06; H05B 6/36; H05B 6/50; H05B 6/54; H05B 6/62
See application file for complete search history.

(56) References Cited

U.S. PATENT DOCUMENTS

2018/0042074 A1   2/2018   Qiu et al.
2019/0306933 A1   10/2019  McCarville et al.

FOREIGN PATENT DOCUMENTS

| DE | 102013213981 A1 | * | 1/2015 | ........... H01F 27/006 |
| EP | 0122133 A1 | * | 10/1984 | ............... H01F 5/02 |
| WO | WO-2012098851 A1 | * | 7/2012 | ............ B60L 11/182 |

* cited by examiner

*Primary Examiner* — Dana Ross
*Assistant Examiner* — Joe E Mills, Jr.
(74) *Attorney, Agent, or Firm* — Jonathan J. Sapan

(57) ABSTRACT

An inductor assembly includes a fixture element having a central core and support structures coupled to and projecting outwardly from the central core, each of the support structures having an outer edge with a notched profile of indentations extending toward the central core, and a helical inductor having multiple turns, the turns being seated in the indentations of the at least two support structures. The support structures may be equidistantly spaced apart from one another about the central core by air gaps. The inductor assembly may be incorporated in an impedance matching network, and one or more impedance matching networks may be incorporated in a defrosting system. The impedance matching network may be a single-ended network or a double-ended network.

19 Claims, 11 Drawing Sheets

1300

INDUCTOR ASSEMBLY, IMPEDANCE MATCHING NETWORK AND SYSTEM INCLUDING INDUCTOR ASSEMBLY

CROSS-REFERENCE TO RELATED APPLICATIONS

This application claims the priority under 35 U.S.C. § 119 of China patent application no. 202010439255.3, filed May 22, 2020 the contents of which are incorporated by reference herein.

TECHNICAL FIELD OF THE INVENTION

The present invention relates generally to inductors. More specifically, the present invention relates to an inductor assembly for an impedance matching network, and a system for defrosting a load that includes the inductor assembly.

BACKGROUND OF THE INVENTION

Conventional capacitive food defrosting (or thawing) systems include large planar electrodes contained within a heating compartment. After a food load is placed between the electrodes and the electrodes are brought into contact with the food load, low power electromagnetic energy is supplied to the electrodes to provide gentle warming of the food load. As the food load thaws during the defrosting operation, the impedance of the food load changes. Accordingly, the power transfer to the food load also changes during the defrosting operation. The duration of the defrosting operation may be determined, for example, based on the weight of the food load, and a timer may be used to control cessation of the operation.

Although good defrosting results are possible using such system, the dynamic changes to the food load impedance may result in inefficient defrosting. Accordingly, a defrosting system may implement a matching network to enable an impedance match between a radio frequency (RF) signal source of the defrosting system and the cavity plus load impedance. Air core inductors are widely used as part of such an impedance matching network due to high inductance capability with low loss (e.g., high-Q character), and the impedance matching network is quite sensitive to the inductance of these air core inductors. For example, a small inductance variation may introduce a big difference in the matching circuit. An air core inductor may be formed into a helix constructed using copper wire or copper strip coated with silver. The inductance is determined by its radius, wire diameter, the number of turns, and the gap or spacing between the turns. Unfortunately, a relatively large and heavy air core inductor can have poor inductance consistency and poor anti-vibration performance since it is typically mounted to a substrate (e.g., printed circuit board) at two soldering points.

SUMMARY

Aspects of the disclosure are defined in the accompanying claims.

In a first aspect, there is provided an inductor assembly comprising a fixture element having a central core and support structures coupled to and projecting outwardly from the central core, each of the support structures having an outer edge with a notched profile of indentations extending toward the central core; and a helical inductor having multiple turns, the turns being seated in the indentations of the at least two support structures.

In a second aspect, there is provided an impedance matching network comprising a first input node; a first output node; and a first variable component and a first inductor assembly coupled in series between the first input node and the first output node, a value of the first variable component being adjustable to affect an impedance transformation provided by the impedance matching circuit. The first inductor assembly comprises a fixture element having a central core and support structures coupled to and projecting outwardly from the central core, each of the support structures having an outer edge with a notched profile of indentations extending toward the central core; and a helical inductor having multiple turns, the turns being seated in the indentations of the support structures, the helical inductor having an input end coupled to an output of the first variable component and having an output end coupled to the first output node.

In a third aspect, there is provided a thermal increase system coupled to a cavity configured to contain a load, the thermal increase system comprising a radio frequency (RF) signal source configured to supply an RF signal; a transmission path electrically coupled between the RF signal source and first and second electrodes that are positioned across the cavity; and an impedance matching network electrically coupled along the transmission path. The impedance matching network comprises a first input node; a first output node; and a first variable component and a first inductor assembly coupled in series between the first input node and the first output node, a value of the first variable component being adjustable to affect an impedance transformation provided by the impedance matching circuit. The first inductor assembly comprises a fixture element having a central core and support structures coupled to and projecting outwardly from the central core, each of the support structures having an outer edge with a notched profile of indentations extending toward the central core; and a helical inductor having multiple turns, the turns being seated in the indentations of the support structures, the helical inductor having an input end coupled to an output of the first variable component and having an output end coupled to the first output node.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
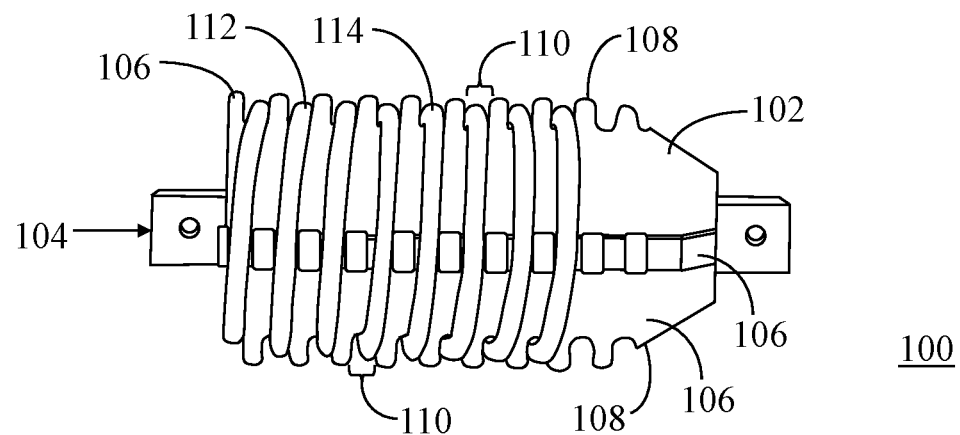
FIG. 1 shows a side view of an inductor assembly in accordance with an embodiment.

In overview, the present disclosure concerns an inductor assembly, an impedance matching network that includes the inductor assembly, and a system that includes at least one impedance matching network with at least one inductor assembly. The system may be a defrosting (or thawing) system that implements one or more impedance matching networks. The inductor assembly includes a fixture element that supports a helical inductor having multiple turns. The fixture element includes multiple support structures surrounding a central core, and each support structure includes an outer edge having a notched profile of indentations. The turns of the helical inductor are seated in the indentations of the support structures. The indentations in the support structures are spread uniformly along the support structures to ensure that the gaps between each turn of the helical inductor are even. Further, the fixture element retains all of the turns of the helical inductors so that the turns cannot freely shift and the fixture element can be directly attached to a substrate, such as a printed circuit board (PCB). Therefore, the fixture element may ensure the consistency of the inductance of the helical inductor and may additionally provide a firm support for the helical inductor to enable good anti-vibration performance.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of the subject matter described herein relate to a solid-state defrosting apparatus that may be incorporated into stand-alone appliances or into other systems. As described in greater detail below, embodiments of a solid-state defrosting apparatus include both "unbalanced" defrosting apparatus and "balanced" apparatus. For example, exemplary "unbalanced" defrosting systems are realized using a first electrode disposed in a cavity, a single-ended amplifier arrangement (including one or more transistors), a single-ended impedance matching network coupled between an output of the amplifier arrangement and the first electrode, and a measurement and control system that can detect when a defrosting operation has completed. In contrast, exemplary "balanced" defrosting systems are realized using first and second electrodes disposed in a cavity, a single-ended or double-ended amplifier arrangement (including one or more transistors), a double-ended impedance matching network coupled between an output of the amplifier arrangement and the first and second electrodes, and a measurement and control system that can detect when a defrosting operation has completed. In various embodiments, the impedance matching network includes a variable impedance matching network that can be adjusted during the defrosting operation to improve matching between the amplifier arrangement and the cavity.

Generally, the term "defrosting" means to elevate the temperature of a frozen load (e.g., a food load or other type of load) to a temperature at which the load is no longer frozen (e.g., a temperature at or near 0 degrees Celsius). As used herein, the term "defrosting" more broadly means a process by which the thermal energy or temperature of a load (e.g., a food load or other type of load) is increased through provision of RF power to the load. Accordingly, in various embodiments, a "defrosting operation" may be performed on a load with any initial temperature (e.g., any initial temperature above or below 0 degrees Celsius), and the defrosting operation may be ceased at any final temperature that is higher than the initial temperature (e.g., including final temperatures that are above or below 0 degrees Celsius). That said, the "defrosting operations" and "defrosting systems" described herein alternatively may be referred to as "thermal increase operations" and "thermal increase systems." The term "defrosting" should not be construed to limit application of the invention to methods or systems that are only capable of raising the temperature of a frozen load to a temperature at or near 0 degrees Celsius.

It should be understood that the use of relational terms, if any, such as first and second, top and bottom, and the like are used solely to distinguish one from another entity or action without necessarily requiring or implying any actual such relationship or order between such entities or actions. Further, any connecting lines shown in the various figures contained herein are intended to represent exemplary functional relationships and/or physical couplings between the various elements.

FIG. 1 shows a side view of an inductor assembly 100 in accordance with an embodiment. Inductor assembly 100 includes a fixture element 102 having a central core 104 and support structures 106 coupled to and projecting outwardly from central core 104. Each of support structures 106 has an outer edge 108 with a notched profile of indentations 110 extending toward central core 104. Inductor assembly 100 further includes a helical inductor 112 having multiple turns 114, in which turns 114 are seated in indentations 110 of support structures 106.

Figure 2A:
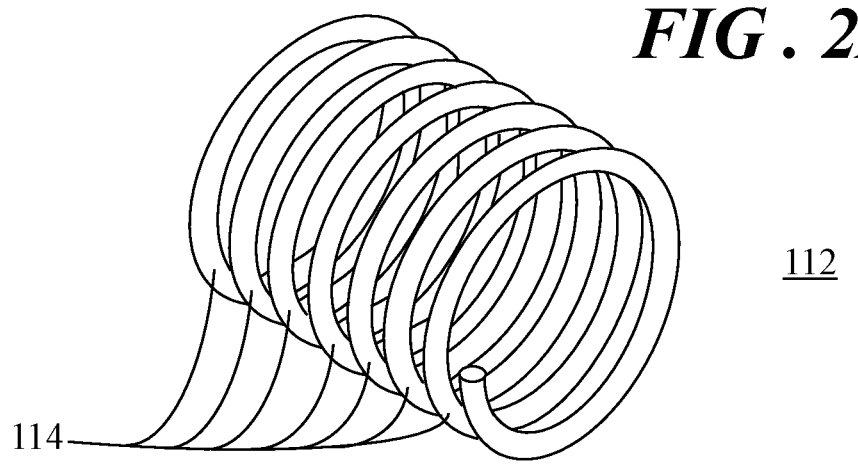
FIG. 2A shows a perspective view of a helical inductor.
Figure 2B:
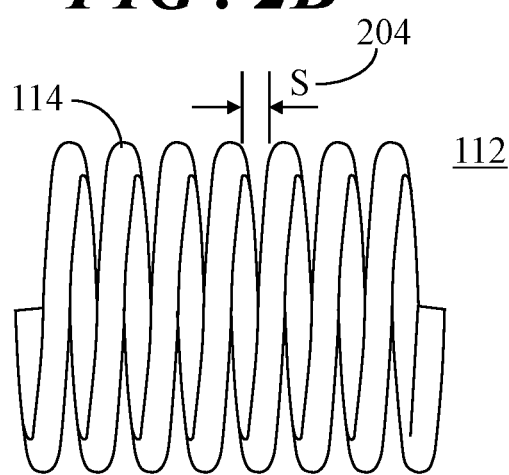
FIG. 2B shows a side view of the helical inductor.
Figure 2C:
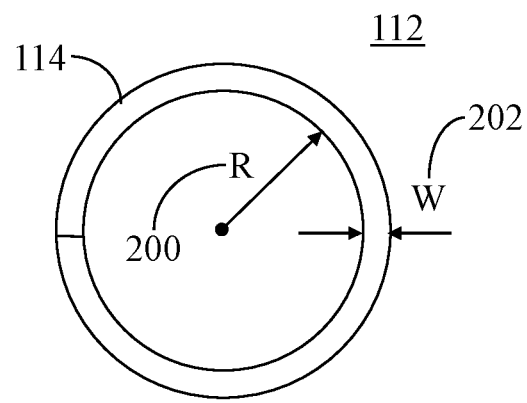
FIG. 2C shows an end view of the helical inductor.

Referring now to FIGS. 2A, 2B, and 2C, FIG. 2A shows a perspective view of helical inductor 112, FIG. 2B shows a side view of helical inductor 112, and FIG. 2C shows an end view of helical inductor 112. In general, helical inductor 112 is an air core coil that does not use a magnetic core made of a ferromagnetic material. Helical inductor 112 may formed into a helix constructed from, for example, copper wire or copper strip coated silver. The inductance of helical inductor 112 is determined by its radius 200, R, the wire diameter 202, W, a spacing width 204, S, between turns 114, and the number of turns 114.

The machinery used to manufacture helical inductors, such as helical inductor 112, can effectively yield helical inductors having the same radius 200 and wire diameter 202. However, the manufacturing machinery may not yield a consistent spacing width 204, between each of turns 114 due to the flexibility of the conductive material used to produce the helical inductors. This situation can cause inductance variation in the helical inductors. Further, a side effect that can occur in air core coils is that mechanical vibration of turns 114 during operation can cause variations in the inductance. As will be discussed in detail below, the problems associated with inductance variation in helical inductor 112 may be mitigated by supporting helical inductor 112 on fixture element 102.

Figure 3A:
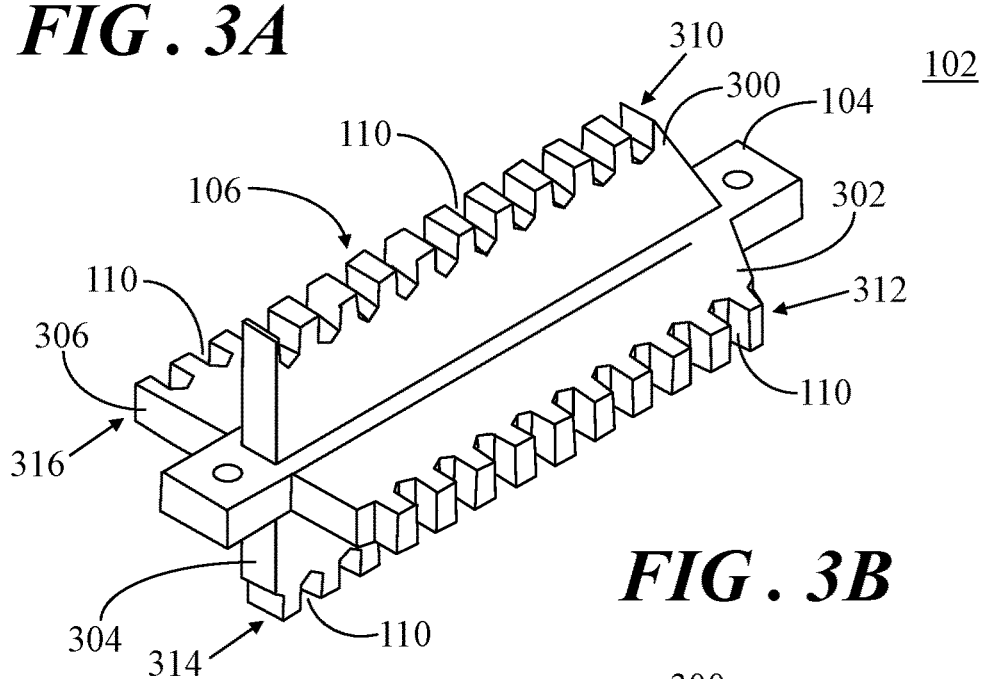
FIG. 3A shows a perspective view of a fixture element of the inductor assembly in accordance with an example embodiment.
Figure 3B:
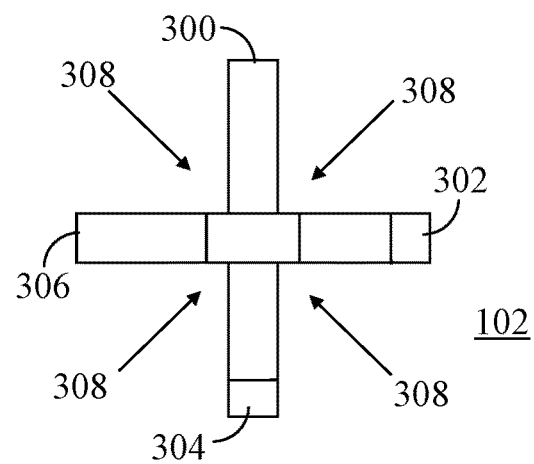
FIG. 3B shows an end view of the fixture element of FIG. 3A.
Figure 3C:
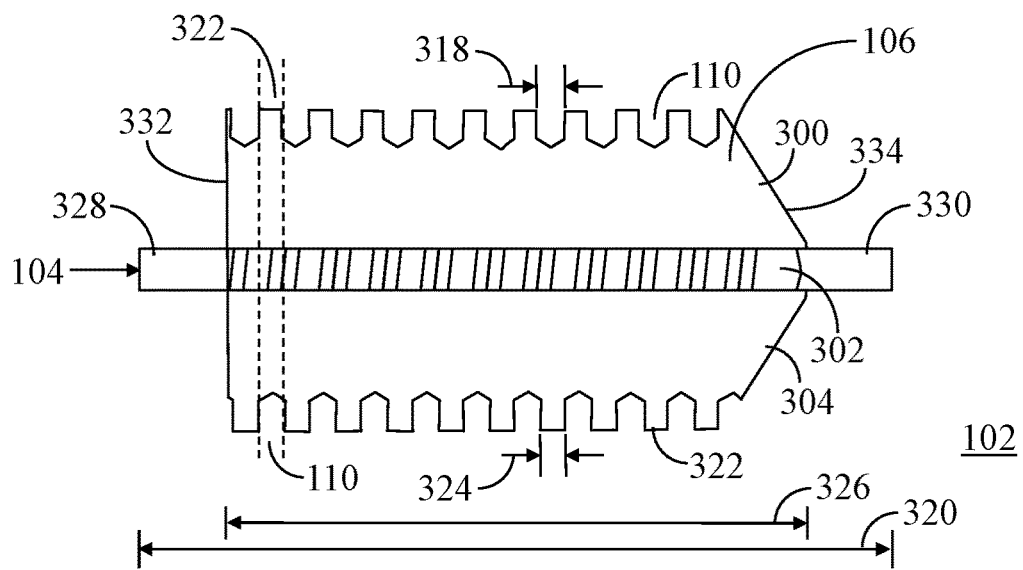
FIG. 3C shows a side view of the fixture element of FIG. 3A.

Referring now to FIGS. 3A, 3B, and 3C, FIG. 3A shows a perspective view of fixture element 102 of inductor assembly 100 (FIG. 1) in accordance with an example embodiment, FIG. 3B shows an end view of fixture element 102, and FIG. 3C shows a side view of fixture element 102. In the example of FIGS. 3A-3C, fixture element 102 includes a total of four support structures 106. In particular, fixture element 102 includes a first support structure 300, a second support structure 302, a third support structure 304, and a fourth support structure 306 equidistantly spaced apart from one another about central core 104. Further, first, second, third, and fourth support structures 300, 302, 304, 306 are spaced apart from one another about central core 104 by air gaps 308.

First support structure 300 includes a first set 310 of indentations 110 extending toward central core 104. Second support structure 302 includes a second set 312 of indentations 110 extending toward central core 104. Third support structure 304 includes a third set 314 of indentations 110 extending toward central core 104. And, fourth support structure 306 includes a fourth set 316 of indentations 110 extending toward central core 104. In general, each of the indentations 110 of the first, second, third, and fourth sets 310, 312, 314, 316 exhibits a first width, referred to herein as an indentation width 318 (see FIG. 3C), parallel to a lengthwise dimension 320 of fixture element 102. Indentation width 318 is generally the same for each of indentations 110, and corresponds to a cross-sectional width, e.g., wire diameter 202 (FIG. 2), of one of turns 14 (FIG. 2C) of helical inductor 112. Further, indentations 110 for each of first, second, third, and fourth sets 310, 312, 314, 316 are separated from one another by spacings 322. Spacings 322 exhibit a spacing width 324 that is generally the same for each of spacings 322. Accordingly, when helical inductor 112 (FIG. 1) resides in indentations 110, spacing width 204 (FIG. 2) between the individual turns 114 of helical inductor 112 remain consistent to thereby reduce variations in inductance.

It can be particularly observed in FIG. 3C that indentations 110 of first, second, third, and fourth sets 310, 312, 314, 316 may be offset in longitudinal dimension 320 relative to one another to accommodate the coiled configuration of helical inductor 112. For example, the offset configuration may yield indentations 110 of first set 310 that directly oppose spacings 322 of third set 314. Fabrication of fixture element 102 to achieve the offset configuration of indentations 110 will be discussed in greater detail in connection with FIG. 5.

Central core 104 of fixture element 102 exhibits a first length, e.g., the lengthwise dimension 320 in this example, that is greater than a second length 326 of support structures 106 such that first and second ends 328, 330 of central core 104 extend longitudinally beyond corresponding ends 332, 334 of support structures 106. First and second ends 328, 330 are configured for attachment to a substrate.

Figure 4:
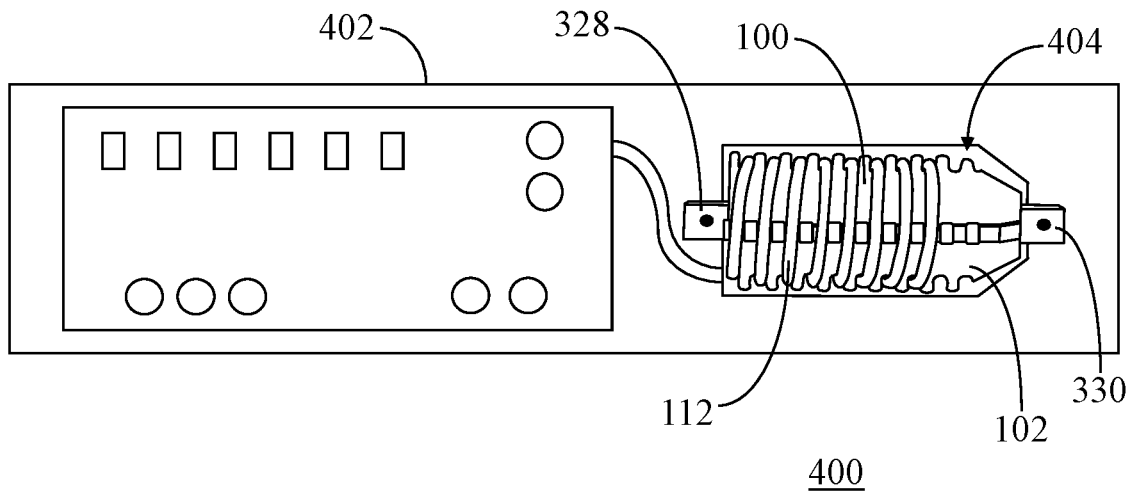
FIG. 4 shows a board assembly that includes the inductor assembly of FIG. 1.

FIG. 4 shows a board assembly 400 that includes inductor assembly 100. Board assembly 400 includes a substrate, such as printed circuit board 402 (PCB). A plurality of active and passive components may be coupled to PCB 400. The active and passive components are represented by a rectangle surrounding smaller rectangles and circles. The various components may be electrically connected via conductive traces (not shown) on PCB 400. These active and passive components can be any of a wide variety of electronic structures such as resistors, capacitors, processing elements, and so forth needed to achieve the particular function of board assembly 400.

In an example, an opening 402 extends through PCB 400. Inductor assembly 100 is positioned in opening 402 and first and second ends 328, 330 of fixture element 102 are coupled to PCB 400 using, for example, an adhesive, a fastener, or any other suitable method. One or more conductive traces formed in PCB 400 may be formed to suitably electrically interconnect helical inductor 112 of inductor assembly 100 to the active and/or passive components of PCB 400. Thus, fixture element 102 of inductor assembly 100 can be used to provide firm support for helical inductor 112 and provide secure coupling of helical inductor 112 to PCB 400 so as to yield effective anti-vibration performance during operation.

Figure 5:
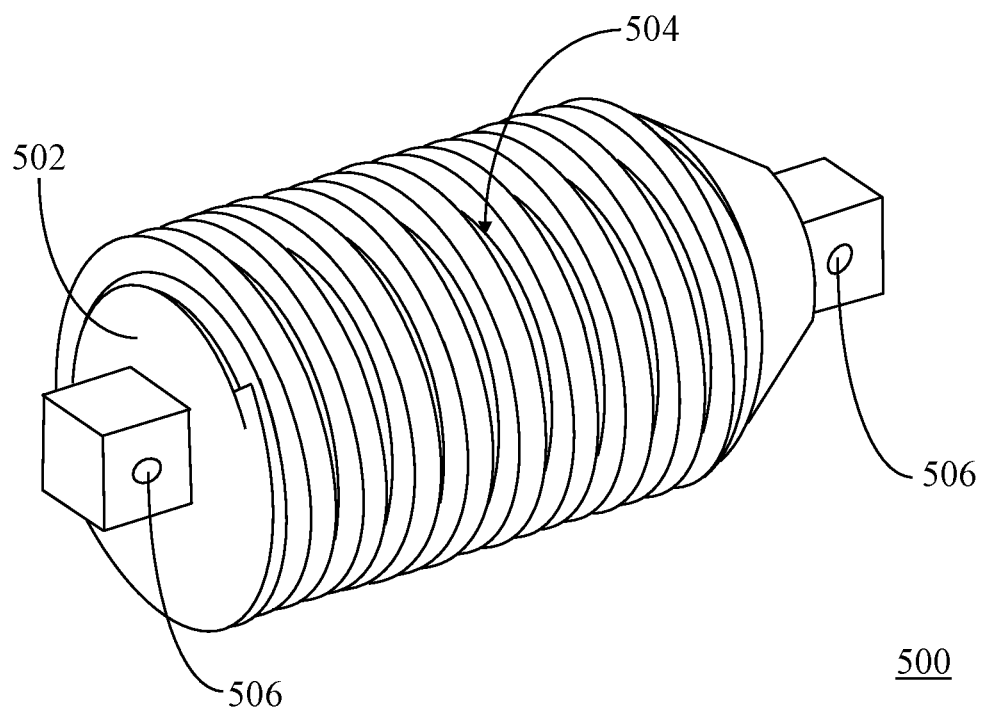
FIG. 5 shows a side view of a solid cylinder fixture element in accordance with an example embodiment.

FIG. 5 shows a side view of a solid cylinder fixture element 500 in accordance with an example embodiment. In order to design fixture element 102 (FIG. 3), an example technique may be to generate a solid cylinder 502, carve a helical slot 504 on the surface of solid cylinder 502 to accommodate helical inductor 112 (FIG. 2). Additionally, mounting holes 506 can be formed at opposing ends of solid cylinder 202.

In some embodiments, solid cylinder fixture element 500 (as well as fixture element 102, FIG. 1, and other fixture elements described below) may be formed from a thermostable material having a thermal stability greater than, for example, two hundred degrees Celsius. As used herein, a thermostable material is a material that is able to resist irreversible change in its physical structure at a high relative temperature. A less common term may be "thermostable plastic" which may refer to a thermosetting plastic that cannot be reshaped when heated. One example material may be polytetrafluoroethylene (PTFE), although other thermostable materials may alternatively be used.

An inductor assembly that includes solid cylinder fixture element 500 (in lieu of fixture element 102) may be mounted to a PCB and can therefore effectively support a helical inductor in some applications. However, since the thermostable material fully fills in the spacing of each of the turns of the helical inductor, the parasitic capacitance of the helical inductor may be undesirably increased as compared to an air core inductor with the same dimensions. As a result, such a fixture element may result in inductance decreases, relative to an air core inductor. Additionally, the self-resonance frequency of the helical inductor may become lower. Still further, solid cylinder fixture element 500 may be undesirably heavy and may consume an undesirably large amount of thermostable material, thereby resulting in higher cost.

To overcome the problems of solid cylinder fixture element 500, material is effectively removed from a design such as solid cylinder fixture element 500 to form fixture element 102 (FIG. 3) having first, second, third, and fourth support structures 302, 304, 306, 308 (FIG. 3), described above. The absence of some of the thermoplastic material (relative to fixture element 500) significantly reduces the weight of fixture element 102 relative to fixture element 500 and yields a similar parasitic capacitance as that of an air core inductor since only the four thinner support structures 302, 304, 306, 308 are involved to contribute to the increase of the parasitic capacitance. However, the four thinner support structures 302, 304, 306, 308 can still effectively support helical inductor 112.

Figure 6A:
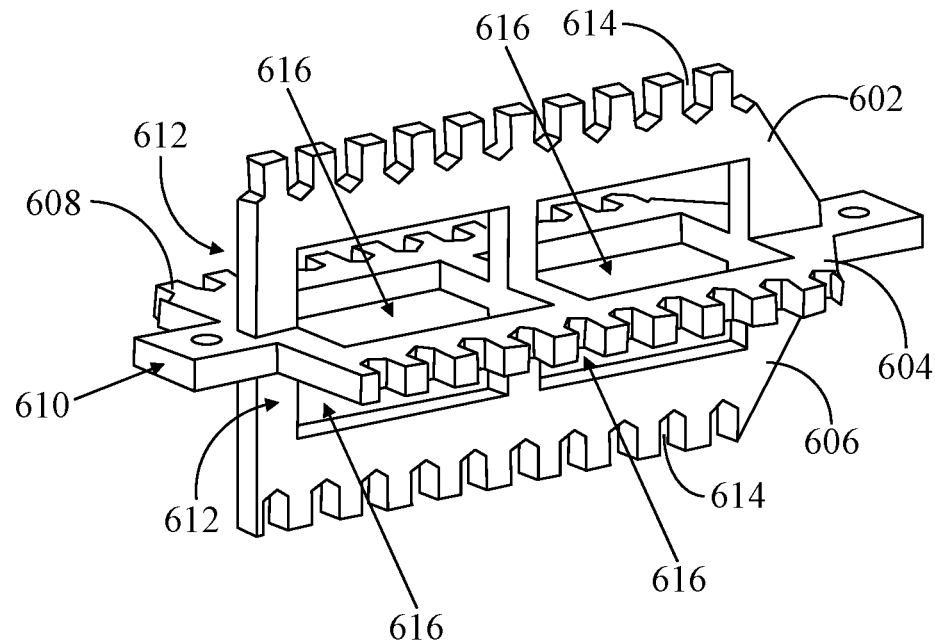
FIG. 6A shows a perspective view of a fixture element in accordance with another example embodiment.
Figure 6B:
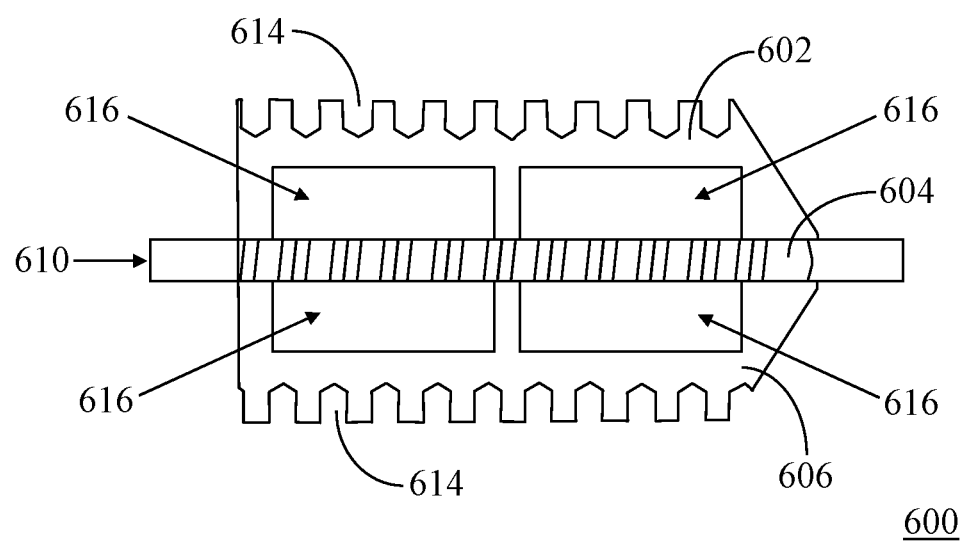
FIG. 6B shows a side view of the fixture element of FIG. 6A.

Referring now to FIGS. 6A and 6B, FIG. 6A shows a perspective view of a fixture element 600 in accordance with another example embodiment and FIG. 6B shows a side view of fixture element 600. In the example of FIGS. 6A and 6B, fixture element 600 includes a total of four support structures. In particular, fixture element 600 includes a first support structure 602, a second support structure 604, a third support structure 606, and a fourth support structure 608 equidistantly spaced apart from one another about a central core 610. Further, first, second, third, and fourth support structures 602, 604, 606, 608 are spaced apart from one another about central core 610 by air gaps 612. Each of first, second, third, and fourth support structures 602, 604, 606, 608 includes a corresponding set of indentations 614, (similar to those described above in connection with FIGS. 3A-3C) configured to support helical inductor 112 (FIGS. 2A-2C).

In accordance with the illustrated embodiment of FIGS. 6A-6B, each of first, second, third, and fourth support structures 602, 604, 606, 608 includes one or more openings 616 extending through them. Fixture element 600 can effectively support helical inductor 112 (FIG. 1) and enable secure mounting to PCB 402 (FIG. 4) while further decreasing weight and material costs relative to fixture element 102 (FIG. 30

Figure 7A:
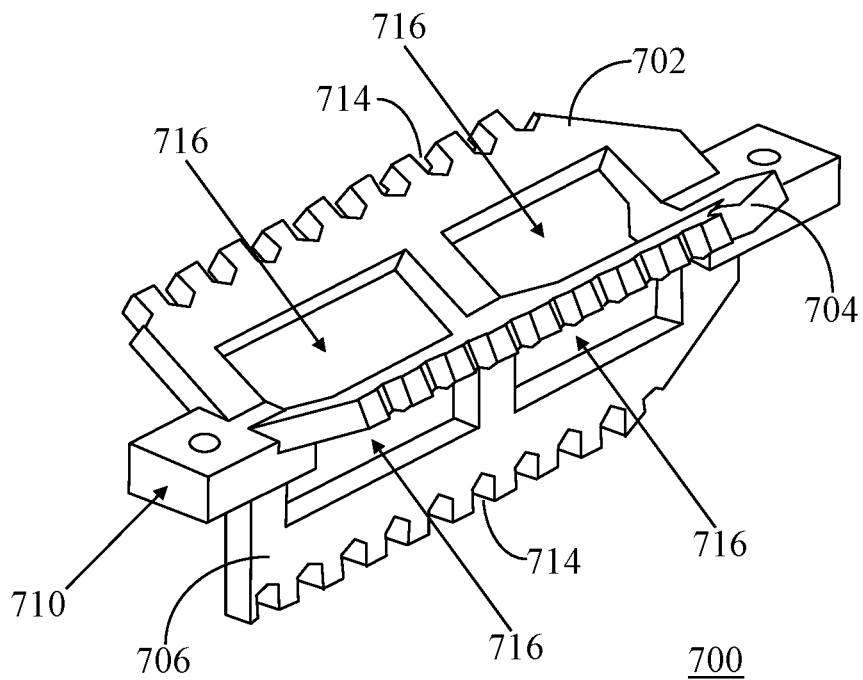
FIG. 7A shows a perspective view of a fixture element in accordance with another example embodiment.
Figure 7B:
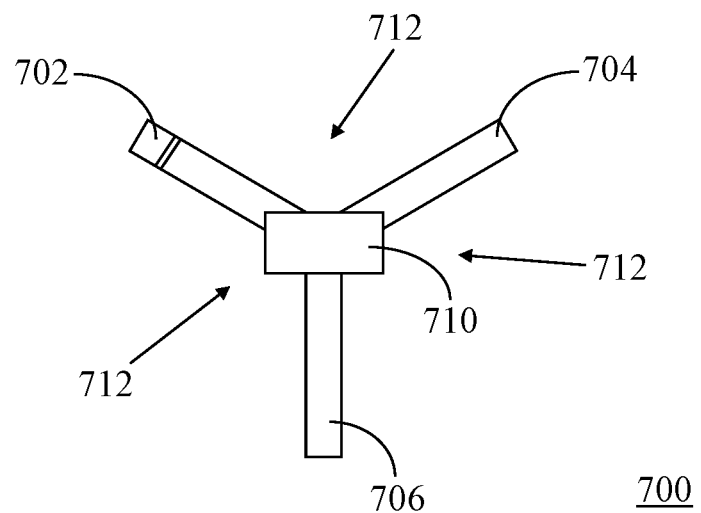
FIG. 7B shows an end view of the fixture element of FIG. 7A.

FIG. 7A shows a perspective view of a fixture element 700 in accordance with another example embodiment and FIG. 7B shows an end view of fixture element 700. In the example of FIGS. 7A and 7B, fixture element 700 includes a total of three support structures. In particular, fixture element 700 includes a first support structure 702, a second support structure 704, and a third support structure 706 equidistantly spaced apart from one another about a central core 710. Further, first, second, and third support structures 702, 704, 706, are spaced apart from one another about central core 710 by air gaps 712. Each of first, second, and third support structures 702, 704, 706 includes a corresponding set of indentations 714, (similar to those described above in connection with FIGS. 3A-3C) configured to support helical inductor 112 (FIGS. 2A-2C).

In accordance with the illustrated embodiment of FIGS. 7A-7B, each of first, second, and third support structures 702, 704, 706 includes one or more openings 716 extending through them. Fixture element 700 can effectively support helical inductor 112 with only three support structures (FIG. 1) and enable secure mounting to PCB 402 (FIG. 4) while further decreasing weight and material costs relative to fixture elements 102, 600.

The preceding discussion was directed to various embodiments of fixture elements for securely supporting an air coil helical inductor. An inductor assembly that includes a fixture element and a helical inductor may be incorporated into a wide variety of circuitry and systems. In accordance with embodiments discussed below, one or more inductor assemblies are implemented in an impedance matching network for a thermal increase system (e.g., a defrosting system).

Figure 8:
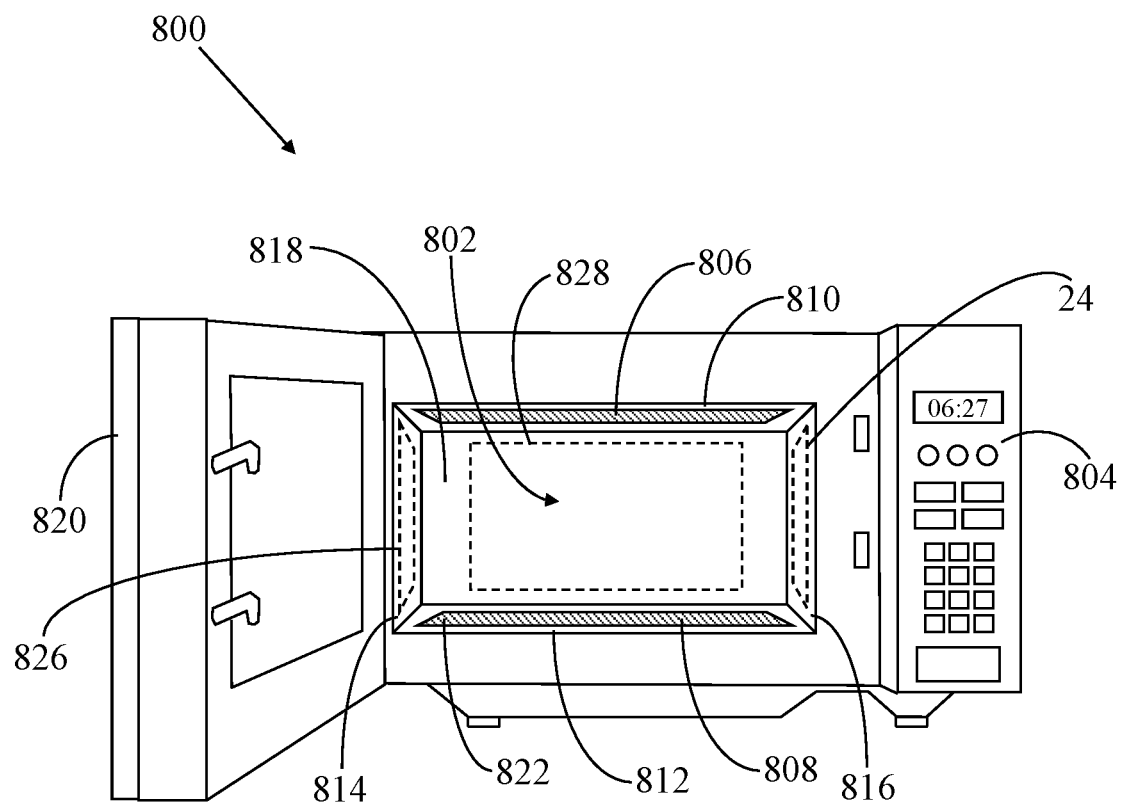
FIG. 8 shows a perspective view of a defrosting appliance in accordance with an example embodiment.

FIG. 8 shows a perspective view of a defrosting appliance 800 in accordance with an example embodiment. Defrosting appliance 800 (alternatively referred to herein as defrosting system 800) includes a defrosting cavity 802, a control panel 804, one or more radio frequency (RF) signal sources (not visible), a power supply (not visible), a first electrode 806, a second electrode 808, impedance matching circuitry (not visible), power detection circuitry (not visible), and a system controller (not visible). Defrosting cavity 802 is defined by interior surfaces of top, bottom, side, and back cavity walls 810, 812, 814, 816, 818 and an interior surface of a door 820. With door 820 closed, defrosting cavity 802 defines an enclosed air cavity. As used herein, the term "air cavity" may mean an enclosed area that contains air or other gasses (e.g., defrosting cavity 802).

According to an "unbalanced" configuration, first electrode 806 is arranged proximate to a cavity wall (e.g., top wall 810), first electrode 806 is electrically isolated from the remaining cavity walls (e.g., walls 812, 814, 816, 818, and door 820), and the remaining cavity walls are grounded. In such a configuration, the system may be simplistically modeled as a capacitor, where first electrode 806 functions as one conductive plate (or electrode), the grounded cavity walls (e.g., walls 812, 814, 816, 818, and door 820) function as a second conductive plate (or electrode), and the air cavity (including any load contained therein) function as a dielectric medium between the first and second conductive plates. Although not shown in FIG. 8, a non-electrically conductive barrier may also be included in defrosting system 800, and the non-conductive barrier may function to electrically and physically isolate the load from the bottom wall 812. Although FIG. 8 shows first electrode 806 being proximate to top wall 812, first electrode 806 may alternatively be proximate to any of the other walls 812, 814, 816, 818, as indicated by electrodes 822, 824, 826, 828.

According to a "balanced" configuration, first electrode 806 is arranged proximate to a first cavity wall (e.g., top wall 810), second electrode 808 is arranged proximate to an opposite, second cavity wall (e.g., bottom wall 812), and the first and second electrodes 806, 808 are electrically isolated from the remaining cavity walls (e.g., walls 814, 816, 818 and door 820). In such a configuration, the system also may be simplistically modeled as a capacitor, where the first electrode 806 functions as one conductive plate (or electrode), second electrode 808 functions as a second conductive plate (or electrode), and the air cavity (including any load contained therein) functions as a dielectric medium between the first and second conductive plates. Although not shown in FIG. 8, a non-electrically conductive barrier may also be included in defrosting system 800, and the non-conductive barrier may function to electrically and physically isolate the load from second electrode 808 and the bottom cavity wall 812. Although FIG. 8 shows first electrode 806 being proximate to top wall 810, and second electrode 808 being proximate to bottom wall 812, first and second electrodes 806, 808 may alternatively be proximate to other opposite walls (e.g., the first electrode may be electrode 824 proximate to wall 816, and the second electrode may be electrode 826 proximate to wall 814.

According to an example, during operation of defrosting system 800, a user (not illustrated) may place one or more loads (e.g., food and/or liquids) into defrosting cavity 802, and optionally may provide inputs via control panel 804 that specify characteristics of the load(s). For example, the specified characteristics may include an approximate weight of the load. In addition, the specified load characteristics may indicate the material(s) from which the load is formed (e.g., meat, bread, liquid). In alternate examples, the load characteristics may be obtained in some other way, such as by scanning a barcode on the load packaging or receiving a radio frequency identification (RFID) signal from an RFID tag on or embedded within the load. Either way, as will be described in more detail later, information regarding such load characteristics enables the system controller to establish an initial state for the impedance matching network of the system at the beginning of the defrosting operation, where the initial state may be relatively close to an optimal state that enables maximum RF power transfer into the load. Alternatively, load characteristics may not be entered or received prior to commencement of a defrosting operation, and the system controller may establish a default initial state for the impedance matching network To begin the defrosting operation, the user may provide an input via control panel 804. In response, the system controller causes the RF signal source(s) to supply an RF signal to first electrode 806 in an unbalanced embodiment, or to both the first and second electrodes 806, 808 in a balanced embodiment, and the electrode(s) responsively radiate electromagnetic energy into defrosting cavity 802. The electromagnetic energy increases the thermal energy of the load (i.e., the electromagnetic energy causes the load to warm up).

During the defrosting operation, the impedance of the load (and thus the total input impedance of the defrosting cavity 802 plus load) changes as the thermal energy of the load increases. The impedance changes alter the absorption of RF energy into the load, and thus alter the magnitude of reflected power. According to an example, power detection circuitry continuously or periodically measures the reflected power along a transmission path between the RF signal source and the electrode(s) 806, 808. Based on these measurements, the system controller may detect completion of the defrosting operation, as will be described in detail below. According to a further embodiment, the impedance matching network is variable, and based on the reflected power measurements (or both the forward and reflected power measurements), the system controller may alter the state of the impedance matching network during the defrosting operation to increase the absorption of RF power by the load.

Defrosting system 800 of FIG. 8 is embodied as a counter-top type of appliance. In other configurations, defrosting system 800 also may include components and functionality for performing microwave cooking operations. Alternatively, components of a defrosting system may be incorporated into other types of systems or appliances.

Figure 9:
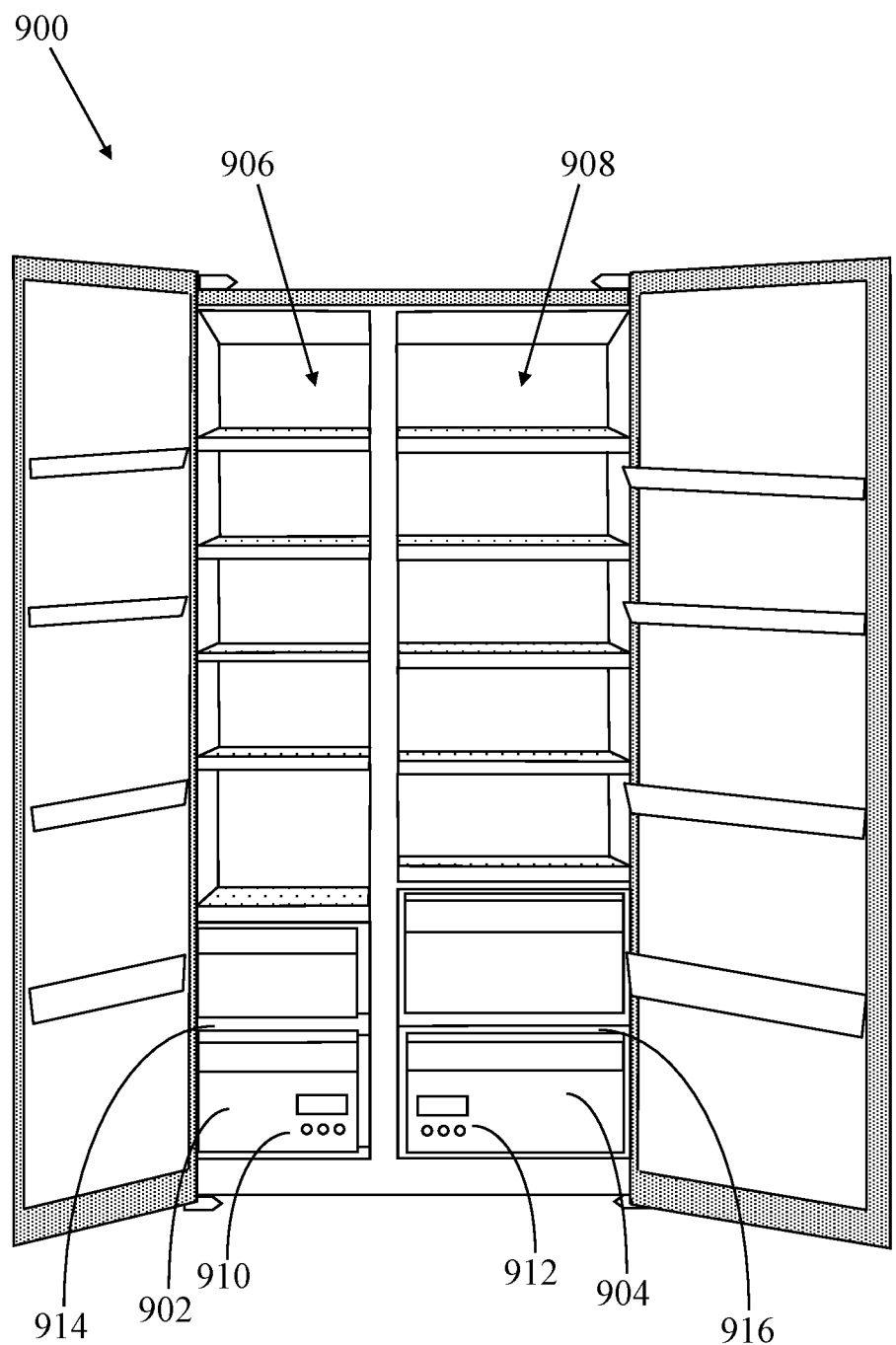
FIG. 9 shows a perspective view of a refrigerator/freezer appliance that includes other example embodiments of defrosting systems.

FIG. 9 shows a perspective view of a refrigerator/freezer appliance 900 that includes other example embodiments of defrosting systems 902, 904. More specifically, defrosting system 902 is shown to be incorporated within a freezer compartment 906 of the appliance 900, and defrosting system 904 is shown to be incorporated within a refrigerator compartment 908 of appliance 900. An actual refrigerator/freezer appliance likely would include only one of the defrosting systems 902, 904, but both are shown in FIG. 9 to concisely convey both embodiments.

Similar to defrosting system 800, each of defrosting systems 902, 904 includes a defrosting cavity, a control panel 910, 912, one or more RF signal sources, a power supply, a first electrode, a second electrode, impedance matching circuitry, power detection circuitry, and a system controller (all of which are not visible in FIG. 9). For example, the defrosting cavity may be defined by interior surfaces of bottom, side, front, and back walls of a drawer, and an interior top surface of a fixed shelf 914, 916 under which the drawer slides. With the drawer slid fully under the shelf, the drawer and shelf define the cavity as an enclosed air cavity. The components and functionalities of the defrosting systems 902, 904 may be substantially the same as the components and functionalities of defrosting system 800, in various embodiments.

In addition, each of defrosting systems 902, 904 may have sufficient thermal communication with the freezer or refrigerator compartment 906, 908, respectively, in which the system 902, 904 is disposed. In such an embodiment, after completion of a defrosting operation, the load may be maintained at a safe temperature (i.e., a temperature at which food spoilage is retarded) until the load is removed from the system 902, 904. More specifically, upon completion of a defrosting operation by the freezer-based defrosting system 902, the cavity within which the defrosted load is contained may thermally communicate with freezer compartment 906, and if the load is not promptly removed from the cavity, the load may re-freeze. Similarly, upon completion of a defrosting operation by the refrigerator-based defrosting system 904, the cavity within which the defrosted load is contained may thermally communicate with refrigerator compartment 908, and if the load is not promptly removed from the cavity, the load may be maintained in a defrosted state at the temperature within the refrigerator compartment 908.

Those of skill in the art would understand, based on the description herein, that embodiments of defrosting systems may be incorporated into systems or appliances having other configurations, as well. Accordingly, the above-described implementations of defrosting systems in a stand-alone appliance, a microwave oven appliance, a freezer, and a refrigerator are not meant to limit use of the embodiments only to those types of systems.

Although defrosting systems 800, 902, 904 are shown with their components in particular relative orientations with respect to one another, it should be understood that the various components may be oriented differently, as well. In addition, the physical configurations of the various components may be different. For example, control panels 804, 910, 912 may have more, fewer, or different user interface elements, and/or the user interface elements may be differently arranged. In addition, although a substantially cubic defrosting cavity 802 is illustrated in FIG. 8, it should be understood that a defrosting cavity may have a different shape, in other embodiments (e.g., cylindrical, and so on). Further, defrosting systems 800, 902, 904 may include additional components (e.g., a fan, a stationary or rotating plate, a tray, an electrical cord, and so on) that are not specifically depicted in FIGS. 8 and 9.

Figure 10:
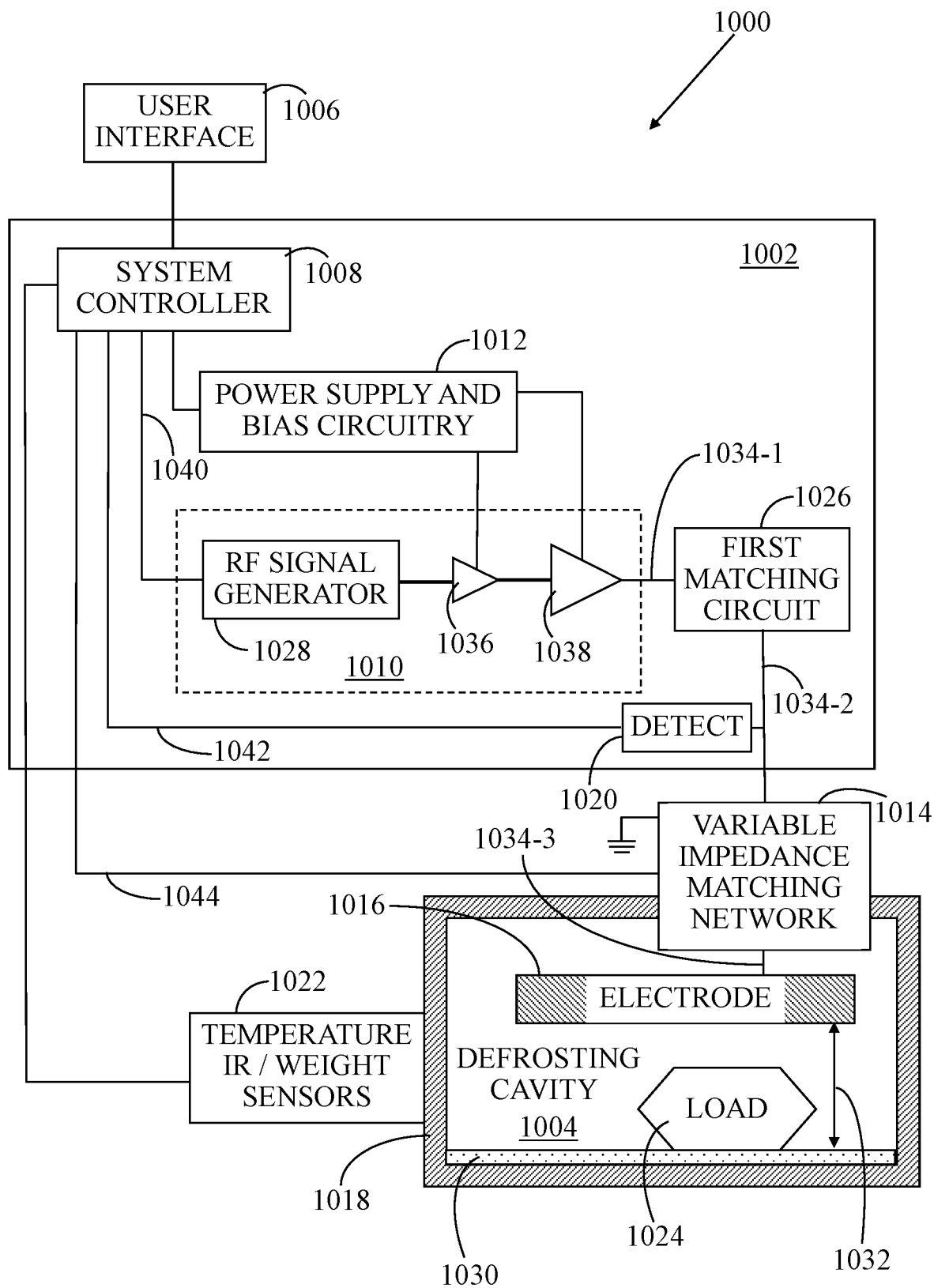
FIG. 10 shows a simplified block diagram of an unbalanced defrosting system in accordance with an example.

FIG. 10 shows a simplified block diagram of an unbalanced defrosting system 1000 (e.g., defrosting system 800, 902, 904, FIGS. 8, 9) in accordance with an example. Defrosting system 1000 includes an RF subsystem 1002, a defrosting cavity 1004, a user interface 1006, a system controller 1008, an RF signal source 1010, power supply and bias circuitry 1012, a variable impedance matching network 1014, an electrode 1016, a containment structure 1018, and power detection circuitry 1020, in an embodiment. It should be understood that FIG. 10 is a simplified representation of a defrosting system 1000 for purposes of explanation and ease of description, and that practical embodiments may include other devices and components to provide additional functions and features, and/or defrosting system 1000 may be part of a larger electrical system.

User interface 1006 may correspond to a control panel (e.g., control panel 804, 910, 912, FIGS. 8, 9), for example, which enables a user to provide inputs to the system regarding parameters for a defrosting operation (e.g., characteristics of the load to be defrosted, and so on), start and cancel buttons, mechanical controls (e.g., a door/drawer open latch), and so on. In addition, the user interface may be configured to provide user-perceptible outputs indicating the status of a defrosting operation (e.g., a countdown timer, visible indicia indicating progress or completion of the defrosting operation, and/or audible tones indicating completion of the defrosting operation) and other information.

Some embodiments of defrosting system 1000 may include temperature sensor(s), IR sensor(s), and/or weight sensor(s) 1022. The temperature sensor(s) and/or IR sensor(s) may be positioned in locations that enable the temperature of a load 1024 to be sensed during a defrosting operation. When provided to system controller 1008, the temperature information enables system controller 1008 to alter the power of the RF signal supplied by RF signal source 1010 (e.g., by controlling the bias and/or supply voltages provided by power supply and bias circuitry 1012), to adjust the state of the variable impedance matching network 1014, and/or to determine when the defrosting operation should be terminated. The weight sensor(s) are positioned under load 1024, and are configured to provide an estimate of the weight of load 1024 to system controller 1008. System controller 1008 may use this information, for example, to determine a desired power level for the RF signal supplied by RF signal source 1010, to determine an initial setting for variable impedance matching network 1014, and/or to determine an approximate duration for the defrosting operation.

RF subsystem 1002 includes system controller 1008, RF signal source 1010, a first impedance matching circuit 1026 (herein "first matching circuit"), power supply and bias circuitry 1012, and power detection circuitry 1020, in an example. System controller 1008 may include one or more general purpose or special purpose processors (e.g., a microprocessor, microcontroller, Application Specific Integrated Circuit (ASIC), and so on), volatile and/or non-volatile memory (e.g., Random Access Memory (RAM), Read Only Memory (ROM), flash, various registers, and so on), one or more communication busses, and other components. According to an embodiment, system controller 1008 is coupled to user interface 1006, RF signal source 1010, variable impedance matching network 1014, power detection circuitry 1020, and sensors 1022 (if included). System controller 1008 is configured to receive signals indicating user inputs received via user interface 1006, and to receive signals indicating RF signal reflected power (and possibly RF signal forward power) from power detection circuitry 1020. Responsive to the received signals and measurements, and as will be described in more detail later, system controller 1008 provides control signals to power supply and bias circuitry 1012 and to an RF signal generator 1028 of RF signal source 1010. In addition, system controller 1008 provides control signals to variable impedance matching network 1014, which cause network 1014 to change its state or configuration.

Defrosting cavity 1004 includes a capacitive defrosting arrangement with first and second parallel plate electrodes that are separated by an air cavity within which load 1024 to be defrosted may be placed. For example, a first electrode (e.g., electrode 1016) may be positioned above the air cavity, and a second electrode may be provided by a portion of containment structure 1018. More specifically, containment structure 1018 may include bottom, top, and side walls, the interior surfaces of which define defrosting cavity 1004 (e.g., defrosting cavity 802, FIG. 8). According to an embodiment, defrosting cavity 1004 may be sealed (e.g., with a door 820, FIG. 8, or by sliding a drawer closed under a shelf 914, 916, FIG. 9) to contain the electromagnetic energy that is introduced into defrosting cavity 1004 during a defrosting operation. Defrosting system 1000 may include one or more interlock mechanisms that ensure that the seal is intact during a defrosting operation. If one or more of the interlock mechanisms indicates that the seal is breached, system controller 1008 may cease the defrosting operation. According to an example, containment structure 1018 is at least partially formed from conductive material, and the conductive portion(s) of containment structure 1018 may be grounded. Alternatively, at least the portion of containment structure 1018 that corresponds to the bottom surface of defrosting cavity 1004 may be formed from conductive material and grounded. Either way, containment structure 1018 (or at least the portion of containment structure 1018 that is parallel with first electrode 1016) functions as a second electrode of the capacitive defrosting arrangement. To avoid direct contact between load 1024 and the grounded bottom surface of defrosting cavity 1004, a non-conductive barrier 1030 may be positioned over the bottom surface of defrosting cavity 1004.

Essentially, defrosting cavity 1004 includes a capacitive defrosting arrangement with first and second parallel plate electrodes 1016, 1018 (e.g., that portion of containment structure 1018 that is parallel with first electrode 1016) that are separated by an air cavity within which load 1024 to be defrosted may be placed. First electrode 1016 is positioned within containment structure 1018 to define a distance 1032 between electrode 1016 and an opposed surface of containment structure 1018 (e.g., the bottom surface, which functions as a second electrode), where distance 1032 renders defrosting cavity 1004 a sub-resonant cavity, in an example.

In various examples, distance 1032 is in a range of about 0.10 meters to about 1.0 meter, although distance 1032 may be smaller or larger, as well. According to an example, distance 1032 may be less than one wavelength of the RF signal produced by RF subsystem 1002. In other words, as mentioned above, defrosting cavity 1004 is a sub-resonant cavity. In some examples, distance 1032 may be less than about half of one wavelength of the RF signal, distance 1032 may be less than about one quarter of one wavelength of the RF signal, distance 1032 may be less than about one eighth of one wavelength of the RF signal, distance 1032 may be less than about one 50th of one wavelength of the RF signal, or distance 352 may be less than about one 100th of one wavelength of the RF signal.

In general, a defrosting system 1000 designed for lower operational frequencies (e.g., frequencies between 10 MHz and 100 MHz) may be designed to have distance 1032 that is a smaller fraction of one wavelength. For example, when system 1000 is designed to produce an RF signal with an operational frequency of about 10 MHz (corresponding to a wavelength of about 30 meters), and distance 1032 is selected to be about 0.5 meters, distance 1032 is about one 60th of one wavelength of the RF signal. Conversely, when system 1000 is designed for an operational frequency of about 300 MHz (corresponding to a wavelength of about 1 meter), and distance 1032 is selected to be about 0.5 meters, distance 1032 is about one half of one wavelength of the RF signal.

With the operational frequency and distance 132 between electrode 1016 and containment structure 1018 being selected to define a sub-resonant interior defrosting cavity 1004, first electrode 1016 and containment structure 1018 are capacitively coupled. More specifically, the first electrode 1016 may be analogized to a first plate of a capacitor, containment structure 1018 may be analogized to a second plate of a capacitor, and load 1024, barrier 1030, and air within defrosting cavity 1004 may be analogized to a capacitor dielectric. Accordingly, first electrode 1016 alternatively may be referred to herein as an "anode," and containment structure 1018 may alternatively be referred to herein as a "cathode."

Essentially, the voltage across the first electrode 1016 and containment structure 1018 heats load 1024 within defrosting cavity 1004. According to various embodiments, RF subsystem 1002 is configured to generate the RF signal to produce voltages between electrode 1016 and containment structure 1018 in a range of about 90 volts to about 3,000 volts, in one example, or in a range of about 3000 volts to about 10,000 volts, in another example, although the system may be configured to produce lower or higher voltages between electrode 1016 and containment structure 1018, as well.

First electrode 1016 is electrically coupled to RF signal source 1010 through first matching circuit 1026, variable impedance matching network 1014, and a conductive transmission path, in an example. First matching circuit 1026 is configured to perform an impedance transformation from an impedance of RF signal source 1010 (e.g., less than about 10 ohms) to an intermediate impedance (e.g., 50 ohms, 75 ohms, or some other value). According to an example, the conductive transmission path includes a plurality of conductors 1034-1, 1034-2, and 1034-3 connected in series, and referred to collectively as transmission path 1034. According to an example, conductive transmission path 1034 is an "unbalanced" path, which is configured to carry an unbalanced RF signal (i.e., a single RF signal referenced against ground). In some embodiments, one or more connectors (not shown, but each having male and female connector portions) may be electrically coupled along transmission path 1034, and the portion of the transmission path 1034 between the connectors may comprise a coaxial cable or other suitable connector.

Variable impedance matching network 1014 is configured to perform an impedance transformation from the above-mentioned intermediate impedance to an input impedance of defrosting cavity 1004 as modified by load 1024 (e.g., on the order of hundreds or thousands of ohms, such as about 1000 ohms to about 4000 ohms or more). Variable impedance matching network 1014 may include a network of passive components (e.g., inductors, capacitors, resistors).

Variable impedance matching network 1014 may include a plurality of variable capacitance networks (e.g., FIG. 11), which may be located inside or outside of defrosting cavity 1004. The capacitance value provided by each of the capacitance networks is established using control signals from system controller 1008. By changing the state of variable impedance matching network 1014 over the course of a defrosting operation to dynamically match the ever-changing cavity input impedance, the amount of RF power that is absorbed by load 1024 may be maintained at a high level despite variations in the load impedance during the defrosting operation.

RF signal source 1010 includes RF signal generator 1028 and a power amplifier (e.g., including one or more power amplifier stages 1036, 1038). In response to control signals provided by system controller 1008 over a connection 1040, RF signal generator 128 is configured to produce an oscillating electrical signal having a frequency in the ISM (industrial, scientific, and medical) band, although the system could be modified to support operations in other frequency bands, as well. RF signal generator 1028 may be controlled to produce oscillating signals of different power levels and/or different frequencies, in various embodiments. For example, RF signal generator 1028 may produce a signal that oscillates in a range of about 10.0 megahertz (MHz) to about 100 MHz and/or from about 100 MHz to about 3.0 gigahertz (GHz). Some desirable frequencies may be, for example, 13.56 MHz (+/−5 percent), 27.125 MHz (+/−5 percent), 40.68 MHz (+/−5 percent), and 2.45 GHz (+/−5 percent). In one particular example, RF signal generator 1028 may produce a signal that oscillates in a range of about 40.66 MHz to about 40.70 MHz and at a power level in a range of about 10 decibel-milliwatts (dBm) to about 15 dBm. Alternatively, the frequency of oscillation and/or the power level may be lower or higher.

In the example of FIG. 10, the power amplifier includes driver amplifier stage 1036 and a final amplifier stage 1038. The power amplifier is configured to receive the oscillating signal from RF signal generator 1028, and to amplify the signal to produce a significantly higher-power signal at an output of the power amplifier. For example, the output signal may have a power level in a range of about 100 watts to about 400 watts or more. The gain applied by the power amplifier may be controlled using gate bias voltages and/or drain supply voltages provided by power supply and bias circuitry 1012 to each amplifier stage 1036, 1038. More specifically, power supply and bias circuitry 1012 provides bias and supply voltages to each RF amplifier stage 1036, 1038 in accordance with control signals received from system controller 1008.

Each amplifier stage 1036, 1038 may be implemented as a power transistor, such as a field effect transistor (FET), having an input terminal (e.g., a gate or control terminal) and two current carrying terminals (e.g., source and drain terminals). Impedance matching circuits (not illustrated) may be coupled to the input (e.g., gate) of driver amplifier stage 1036, between driver and final amplifier stages 1036, 1038, and/or to the output (e.g., drain terminal) of final amplifier stage 1038. Each transistor of amplifier stages 1036, 1038 may include a laterally diffused metal oxide semiconductor FET (LDMOSFET) transistor. However, it should be noted that the transistors are not intended to be limited to any particular semiconductor technology, and in other embodiments, each transistor may be realized as a gallium nitride (GaN) transistor, another type of MOSFET transistor, a bipolar junction transistor (BJT), or a transistor utilizing another semiconductor technology.

In FIG. 10, the power amplifier arrangement is depicted to include two amplifier stages 1036, 1038 coupled in a particular manner to other circuit components. In other embodiments, the power amplifier arrangement may include other amplifier topologies and/or the amplifier arrangement may include only one amplifier stage or more than two amplifier stages. For example, the power amplifier arrangement may include various embodiments of a single-ended amplifier, a Doherty amplifier, a Switch Mode Power Amplifier (SMPA), or another type of amplifier.

Defrosting cavity 1004 and any load 1024 (e.g., food, liquids, and so on) positioned in defrosting cavity 1004 present a cumulative load for the electromagnetic energy (or RF power) that is radiated into cavity 1004 by first electrode 1016. More specifically, defrosting cavity 1004 and load 1024 present an impedance to the system, referred to herein as a "cavity input impedance." The cavity input impedance changes during a defrosting operation as the temperature of load 1024 increases. The cavity input impedance has a direct effect on the magnitude of reflected signal power along conductive transmission path 1034 between the RF signal source 1010 and electrode 1016. In most cases, it is desirable to maximize the magnitude of transferred signal power into defrosting cavity 1004, and/or to minimize the reflected-to-forward signal power ratio along conductive transmission path 1034.

In order to at least partially match the output impedance of the RF signal generator 1028 to the cavity input impedance, first matching circuit 1026 may be electrically coupled along transmission path 1034. First matching circuit 1026 may have any of a variety of configurations. According to an example, first matching circuit 1026 includes fixed components (i.e., components with non-variable component values), although first matching circuit 1026 may include one or more variable components. For example, the first matching circuit 1026 may include any one or more circuits selected from an inductance/capacitance (LC) network, a series inductance network, a shunt inductance network, or a combination of bandpass, high-pass and low-pass circuits. Essentially, first impedance matching circuit 1026 is configured to raise the impedance to an intermediate level between the output impedance of RF signal generator 1028 and the cavity input impedance.

The impedance of many types of food loads changes with respect to temperature in a somewhat predictable manner as the food load transitions from a frozen state to a defrosted state. Accordingly, based on reflected power measurements (and forward power measurements, in some examples) from the power detection circuitry 1020, system controller 1008 is configured to identify a point in time during a defrosting operation when the rate of change of the cavity input impedance indicates that load 1024 is approaching 0° Celsius, at which time system controller 1008 may terminate the defrosting operation.

According to an example, power detection circuitry 1020 may be coupled along transmission path 1034 between the output of RF signal source 1010 and electrode 1016. In a specific example, power detection circuitry 1020 forms a portion of RF subsystem 1002, and may be coupled to the conductor 1034-2 between the output of the first matching circuit 1026 and the input to the variable impedance matching network 1014. Alternatively, power detection circuitry 1020 may be coupled to portion 1034-1 of the transmission path 1034 between the output of the RF signal source 1010 and the input to first matching circuit 1026, or to portion 1034-3 of transmission path 1034 between the output of variable impedance matching network 1014 and the first electrode 1016.

Wherever it is coupled, power detection circuitry 1020 is configured to monitor, measure, or otherwise detect the power of the reflected signals traveling along transmission path 1034 between the RF signal source 1010 and electrode 1016 (i.e., reflected RF signals traveling in a direction from electrode 1016 toward RF signal source 1010). Power detection circuitry 1020 may also be configured to detect the power of the forward signals traveling along the transmission path 1034 between the RF signal source 1010 and electrode 1016 (i.e., forward RF signals traveling in a direction from RF signal source 1010 toward electrode 1016). Over a connection 1042, power detection circuitry 1020 supplies signals to system controller 1008 conveying the magnitudes of the reflected signal power (and the forward signal power, in some examples) to system controller 1008. When both the forward and reflected signal power magnitudes are conveyed, system controller 1008 may calculate a reflected-to-forward signal power ratio, or the S11 parameter. When the reflected signal power magnitude exceeds a reflected signal power threshold, or when the reflected-to-forward signal power ratio exceeds an S11 parameter threshold, this indicates that defrosting system 100 is not adequately matched to the cavity input impedance, and that energy absorption by load 1024 within defrosting cavity 1004 may be sub-optimal. In such a situation, system controller 1008 may orchestrate a process of altering the state of variable matching network 1014 to drive the reflected signal power or the S11 parameter toward or below a desired level (e.g., below the reflected signal power threshold and/or the reflected-to-forward signal power ratio threshold), thus re-establishing an acceptable match and facilitating more optimal energy absorption by load 10024.

More specifically, system controller 1008 may provide control signals over a control path 1044 to variable matching circuit 1014, which cause variable matching circuit 1014 to vary inductive, capacitive, and/or resistive values of one or more components within the circuit, thus adjusting the impedance transformation provided by circuit 1014. Adjustment of the configuration of variable matching circuit 1014 desirably decreases the magnitude of reflected signal power, which corresponds to decreasing the magnitude of the S11 parameter and increasing the power absorbed by load 1024.

As discussed above, variable impedance matching network 1014 is used to match the input impedance of defrosting cavity 1004 plus load 1024 to maximize, to the extent possible, the RF power transfer into load 1024. The initial impedance of defrosting cavity 1004 and load 1024 may not be known with accuracy at the beginning of a defrosting operation. Further, the impedance of load 1024 changes during a defrosting operation as load 1024 warms up. Accordingly, system controller 1008 may provide control signals to variable impedance matching network 1014, which cause modifications to the state of variable impedance matching network 1014. This enables the system controller 1008 to establish an initial state of variable impedance matching network 1014 at the beginning of the defrosting operation that has a relatively low reflected to forward power ratio, and thus a relatively high absorption of the RF power by load 1024. In addition, this enables system controller 1008 to modify the state of variable impedance matching network 1014 so that an adequate match may be maintained throughout the defrosting operation, despite changes in the impedance of load 1024.

Variable matching network 1014 may have any of a variety of configurations. In an embodiment, variable matching network 1014 may include a single-ended network (e.g., network 1100, FIG. 11). The inductance, capacitance, and/or resistance values provided by the variable matching network 1014, which in turn affect the impedance transformation provided by the network 1014, may be established using control signals from system controller 1008. By changing the state of variable matching network 1014 over the course of a defrosting operation to dynamically match the ever-changing impedance of defrosting cavity 1004 plus load 1024 within cavity 1004, the system efficiency may be maintained at a high level throughout the defrosting operation.

Figure 11:
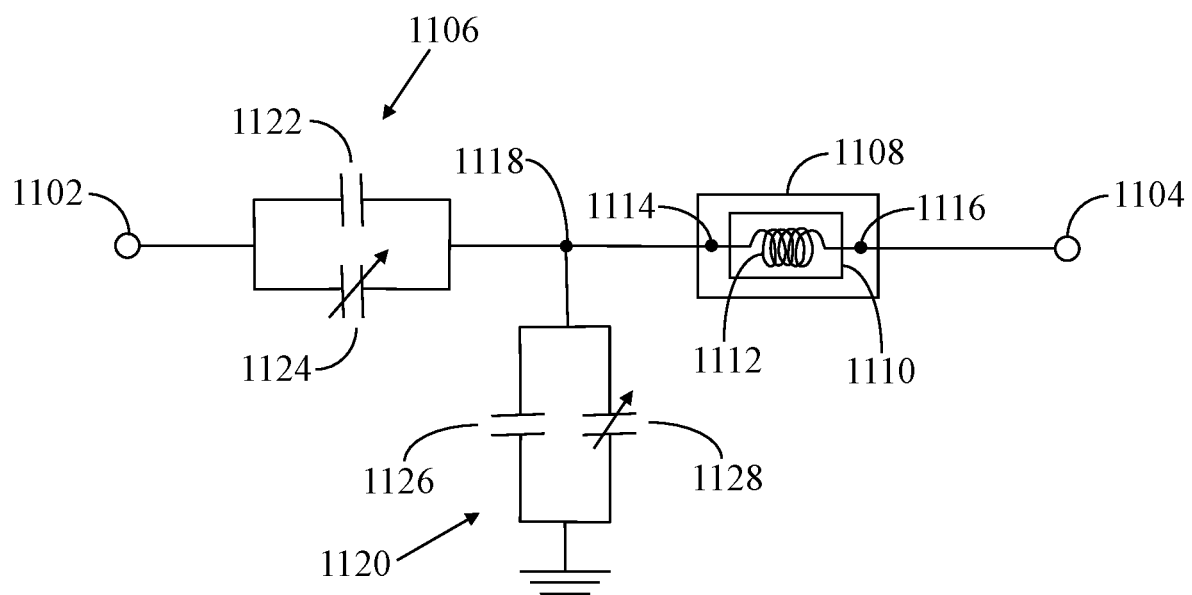
FIG. 11 shows a schematic diagram of a single-ended variable capacitive matching network in accordance with an example.

FIG. 11 shows a schematic diagram of a single-ended variable capacitive matching network 1100 (e.g., variable impedance matching network 1014, FIG. 10) in accordance with an example. Single-ended variable capacitive matching network 1110 functions as a variable impedance matching network, and hence may be alternatively referred to herein as variable impedance matching network 1100. Single-ended variable impedance matching network 1100 may be implemented in a defrosting system (e.g., defrosting system 800, 902, 904, 1000, FIGS. 8, 9, 10).

Variable impedance matching network 1100 includes an input node 1102 and an output node 1104. A variable component in the form of a first capacitance network 1106 and at least one inductor assembly 1108 are coupled in series between the input and output nodes 1102, 1104. Inductor assembly 1108 includes a fixture element 1110 (e.g., any of fixture elements 102, 600, 700, FIGS. 1, 3, 6, 7) and a helical inductor 1112 (e.g., helical inductor 112, FIGS. 1, 2) supported by fixture element 1110. Helical inductor 1112 has an input end 1114 coupled to an output of first variable impedance network 1106 and an output end 1116 coupled to first output node 1104.

Fixture element 1110 and helical inductor 1112 of inductor assembly 1108 are shown in highly simplified form in the schematic diagram of FIG. 11. However, it should be understood that fixture element 1110 includes a central core and support structures coupled to and projecting outwardly from the central core, and the support structures have an outer edge with indentations extending toward the central core. Further, the support structures are spaced apart from one another about the central core by air gaps. Helical inductor 1112 includes multiple turns which are seated in the indentations of the support structures. Additionally, first and second ends of the central core are configured for attachment to a substrate (e.g., PCB 402, FIG. 4). Various details and embodiments of fixture element 1110 and helical inductor 1112 are discussed above in connection with FIGS. 1-7, and are not repeated herein for brevity.

When incorporated into a defrosting system (e.g., system 1000, FIG. 10), input node 1102 of matching network 1110 is electrically coupled to an output of the RF signal source (e.g., RF signal source 1010, FIG. 10), and output node 1104 is electrically coupled to an electrode (e.g., first electrode 1016, FIG. 10) within the defrosting cavity (e.g., defrosting cavity 1004, FIG. 10).

An intermediate node 1118 is positioned between first variable capacitance network 1106 and inductor assembly 1108. A second variable component, in the form of a second variable capacitance network 1120 is coupled between intermediate node 1118 and a ground reference terminal (e.g., the grounded containment structure 1018, FIG. 10), in an embodiment. Helical inductor 1112 is relatively large in both size and inductance value, in an embodiment, as it may be designed for relatively low frequency (e.g., about 40.66 MHz to about 40.70 MHz) and high power (e.g., about 50 W to about 500 W) operation. For example, helical inductor 1112 may have a value in a range of about 200 nH to about 600 nH, although its value may be lower and/or higher, in other embodiments. According to an embodiment, helical inductor 1112 is a fixed-value, lumped inductor (e.g., an air coil). Fixture element 1110 suitably supports helical inductor 1112 to enable inductance consistency and to enable secure attachment to a substrate (e.g., PCB 402, FIG. 4) to yield effective anti-vibration performance during operation.

First variable capacitance network 1106 is coupled between input node 1102 and intermediate node 1118. First variable capacitance network 1106 may be configurable to match the impedance of the RF signal source (e.g., RF signal source 1010, FIG. 10) as modified by the first matching circuit (e.g., first matching circuit 1026, FIG. 10), or more particularly to match the impedance of the final stage power amplifier (e.g., amplifier 1038, FIG. 10) as modified by the first matching circuit (e.g., circuit 1026, FIG. 10). Accordingly, first variable capacitance network 1106 may be referred to as the "RF signal source matching portion" of variable impedance matching network 1100.

In an example, first variable capacitance network 1106 includes a first fixed-value capacitor 1122 coupled in parallel with a first variable capacitor 1124. First fixed-value capacitor 1122 may have a capacitance value in a range of about 1 picofarad (pF) to about 100 pF. First variable capacitor 1124 may include a network of capacitive components that may be selectively coupled together to provide capacitances in a range of 0 pF to about 100 pF. As such, the total capacitance value provided by the first variable capacitance network 1106 may be in a range of about 1 pF to about 200 pF, although the range may extend to lower or higher capacitance values, as well.

A "cavity matching portion" of the variable impedance matching network 1100 is provided by second variable capacitance network 1120, which is coupled between node 1118 (located between the first variable capacitance network 1106 and helical inductor 1112) and the ground reference terminal. In an example, second variable capacitance network 1120 includes a second fixed-value capacitor 1126 coupled in parallel with a second variable capacitor 1128. Second fixed-value capacitor 1126 may have a capacitance value in a range of about 1 pF to about 100 pF. Second variable capacitor 1128 may include a network of capacitive components that may be selectively coupled together to provide capacitances in a range of 0 pF to about 100 pF. As such, the total capacitance value provided by second variable capacitance network 1120 may be in a range of about 1 pF to about 200 pF, although the range may extend to lower or higher capacitance values, as well. The states of the first and second variable capacitance networks 1106, 1120 may be changed to provide multiple capacitance values, and thus may be configurable to optimally match the impedance of the cavity plus load (e.g., defrosting cavity 1004 plus load 1024, FIG. 10) to the RF signal source (e.g., RF signal source 1010, FIG. 10).

The description associated with FIGS. 10-11 discusses, in detail, an "unbalanced" defrosting apparatus, in which an RF signal is applied to one electrode (e.g., electrode 1016, FIG. 10), and the other "electrode" (e.g., containment structure 1018, FIG. 10) is grounded. As mentioned above, an alternate embodiment of a defrosting apparatus comprises a "balanced" defrosting apparatus. In such an apparatus, balanced RF signals are provided to both electrodes.

Figure 12:
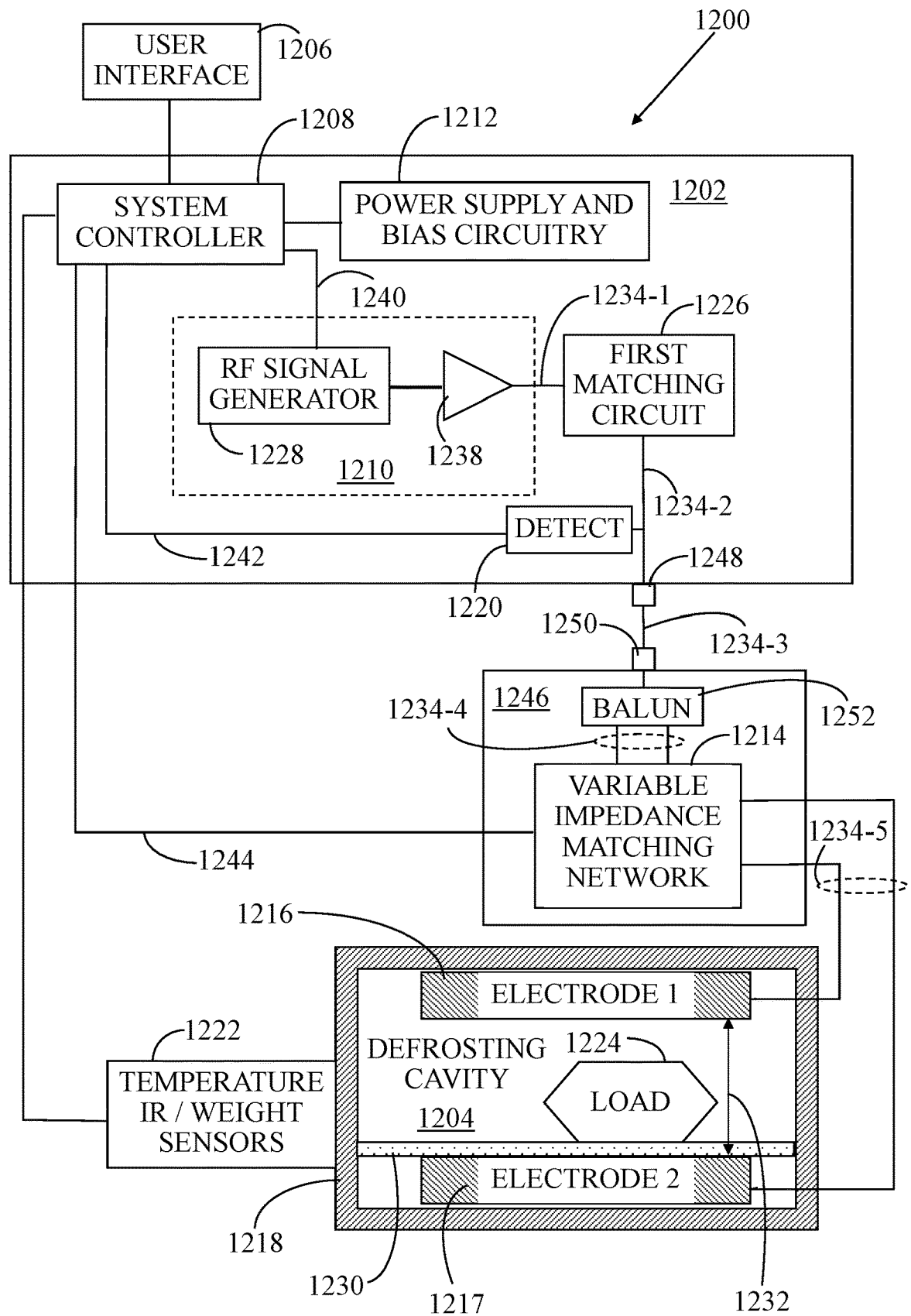
FIG. 12 shows a simplified block diagram of an balanced defrosting system in accordance with an example.

FIG. 12 shows a simplified block diagram of an balanced defrosting system 1200 (e.g., defrosting system 800, 902, 904, FIGS. 8, 9) in accordance with an example. Defrosting system 1200 includes an RF subsystem 1202, a defrosting cavity 1204, a user interface 1206, a system controller 1208, an RF signal source 1210, power supply and bias circuitry 1212, a variable impedance matching network 1214, two electrodes 1216, 1217 (separated across cavity 1204 by a distance 1232), and power detection circuitry 1220, in an embodiment. In addition, in other embodiments, defrosting system 1200 may include temperature sensor(s), infrared (IR) sensor(s), and/or weight sensor(s) 1222, although some or all of these sensor components may be excluded.

RF subsystem 1202 includes system controller 1208, RF signal source 1210, a first impedance matching circuit 1226 (herein "first matching circuit"), power supply and bias circuitry 1212, and power detection circuitry 1220, in an example. System controller 1208 is operatively and communicatively coupled to user interface 1206, RF signal source 1210, power supply and bias circuitry 1212, power detection circuitry 1220, variable impedance matching network 1214, power detection circuitry 1220, and sensors 1222 (if included). System controller 1208 is configured to receive signals indicating user inputs received via user interface 1206, and to receive signals indicating RF signal reflected power (and possibly RF signal forward power) from power detection circuitry 1220. Responsive to the received signals and measurements, and as will be described in more detail later, system controller 1208 provides control signals to power supply and bias circuitry 1212 and to an RF signal generator 1228 of RF signal source 1210. In addition, system controller 1208 provides control signals to a variable matching subsystem 1246 (over control path 1244), which cause subsystem 1246 to change the state or configuration of a variable impedance matching network 1214 of subsystem 1246.

With the operational frequency and distance 1232 between electrodes 1216, 1217 being selected to define a sub-resonant interior defrosting cavity 1204, first and second electrodes 1216, 1217 are capacitively coupled. More specifically, first electrode 1216 may be analogized to a first plate of a capacitor, second electrode 1217 may be analogized to a second plate of a capacitor, and a load 1224, a nonconductive barrier 1230, and air within defrosting cavity 1204 may be analogized to a capacitor dielectric. Accordingly, first electrode 1216 alternatively may be referred to herein as an "anode," and second electrode 1217 may alternatively be referred to herein as a "cathode." Essentially, the voltage across first and second electrodes 1216, 1217 heats load 1224 within cavity 1204. According to various embodiments, RF subsystem 1202 is configured to generate the RF signal to produce voltages across the electrodes 1216, 1217.

An output of RF signal source 1210 of RF subsystem 1202, is electrically coupled to variable matching subsystem 1246 through a conductive transmission path, which includes a plurality of conductors 1234-1, 1234-2, 1234-3, 1234-4, and 1234-5 connected in series, and referred to collectively as transmission path 1234. According to an embodiment, conductive transmission path 1234 includes an "unbalanced" portion and a "balanced" portion, where the "unbalanced" portion is configured to carry an unbalanced RF signal (i.e., a single RF signal referenced against ground), and the "balanced" portion is configured to carry a balanced RF signal (i.e., two signals referenced against each other). The "unbalanced" portion of transmission path 1234 may include unbalanced first and second conductors 1234-1, 1234-2 within RF subsystem 122, one or more connectors 1248, 1250 (each having male and female connector portions), and an unbalanced third conductor 1234-3 electrically coupled between the connectors 1248, 1250. Third conductor 1234-3 comprises a coaxial cable, although the electrical length may be shorter or longer, as well. In an alternate embodiment, variable matching subsystem 1246 may be housed with RF subsystem 1202, and in such an embodiment, conductive transmission path 1234 may exclude the connectors 1248, 1250 and third conductor 1234-3. Either way, the "balanced" portion of conductive transmission path 1234 includes a balanced fourth conductor 1234-4 within variable matching subsystem 1246, and a balanced fifth conductor 1234-5 electrically coupled between variable matching subsystem 1246 and electrodes 1216, 1217.

As indicated in FIG. 12, variable matching subsystem 1246 houses an apparatus configured to receive, at an input of the apparatus, the unbalanced RF signal from RF signal source 1210 over the unbalanced portion of the transmission path (i.e., the portion that includes unbalanced conductors 1234-1, 1234-2, and 1234-3), to convert the unbalanced RF signal into two balanced RF signals (e.g., two RF signals having a phase difference between 120 and 240 degrees, such as about 180 degrees), and to produce the two balanced RF signals at two outputs of the apparatus. For example, the conversion apparatus may be a balun 1252. The balanced RF signals are conveyed over balanced conductors 1234-4 to variable impedance matching network 1214 and, ultimately, over balanced conductors 1234-5 to electrodes 1216, 1217. As will be described in more detail below, variable impedance matching network 1214 is a double-ended variable matching circuit configured to receive the balanced RF signals (e.g., over connections 1234-4), to perform an impedance transformation corresponding to a then-current configuration of the double-ended variable impedance matching network 1214, and to provide the balanced RF signals to first and second electrodes 716, 717 over connections 1234-5.

RF signal source 1210 includes an RF signal generator 1228 and a power amplifier 1238 (e.g., including one or more power amplifier stages). In response to control signals provided by system controller 1208 over a connection 1240, RF signal generator 1228 is configured to produce an oscillating electrical signal having a frequency in an ISM (industrial, scientific, and medical) band, although the system could be modified to support operations in other frequency bands, as well. RF signal generator 1228 may be controlled to produce oscillating signals of different power levels and/or different frequencies.

Power amplifier 1238 is configured to receive the oscillating signal from RF signal generator 1228, and to amplify the signal to produce a significantly higher-power signal at an output of the power amplifier 1238. Power amplifier 1238 may include one or more amplification stages. In FIG. 12, power amplifier 1238 is depicted to include one amplifier stage coupled in a particular manner to other circuit components. In other embodiments, power amplifier 1238 may include other amplifier topologies and/or the amplifier arrangement may include two or more amplifier stages.

Defrosting cavity 1204 and any load 1224 (e.g., food, liquids, and so on) positioned in defrosting cavity 1204 present a cumulative load for the electromagnetic energy (or RF power) that is radiated into defrosting cavity 1204 by the electrodes 1216, 1217. More specifically, and as described previously, defrosting cavity 1204 and load 1224 present an impedance to the system, referred to herein as a "cavity plus load impedance." Again, the cavity plus load impedance changes during a defrosting operation as the temperature of load 1224 increases. The cavity plus load impedance has a direct effect on the magnitude of reflected signal power along the conductive transmission path 1234 between RF signal source 1210 and electrodes 1216, 1217. In most cases, it is desirable to maximize the magnitude of transferred signal power into cavity 1204, and/or to minimize the reflected-to-forward signal power ratio along conductive transmission path 1234.

In order to at least partially match the output impedance of RF signal generator 1228 to the cavity input impedance, first matching circuit 1226 is electrically coupled along transmission path 1234. First matching circuit 1226 is configured to perform an impedance transformation from an impedance of RF signal source 1210 (e.g., less than about 10 ohms) to an intermediate impedance (e.g., 50 ohms, 75 ohms, or some other value). First matching circuit 1226 may have any of a variety of configurations in order to raise the impedance to an intermediate level between the output impedance of RF signal generator 1228 and the cavity plus load impedance.

As mentioned above, power detection circuitry 1220 is coupled along transmission path 1234 between the output of the RF signal source 1210 and the electrodes 1216, 1217. Power detection circuitry 1220 is configured to monitor, measure, or otherwise detect the power of the reflected signals traveling along transmission path 1234 between RF signal source 1210 and one or both of the electrode(s) 1216, 1217. Power detection circuitry 1220 may also be configured to detect the power of the forward signals traveling along transmission path 1234 between RF signal source 1210 and electrode(s) 1216, 1217.

Over a connection 1242, power detection circuitry 1220 supplies signals to system controller 1208 conveying the measured magnitudes of the reflected signal power, and in some embodiments, also the measured magnitude of the forward signal power. When the reflected signal power magnitude exceeds a reflected signal power threshold, or when the reflected-to-forward signal power ratio exceeds an S11 parameter threshold, this indicates that the system 1200 is not adequately matched to the cavity plus load impedance, and that energy absorption by load 1224 within cavity 1204 may be sub-optimal. In such a situation, system controller 1208 orchestrates a process of altering the state of variable impedance matching network 1214 to drive the reflected signal power or the S11 parameter toward or below a desired level (e.g., below the reflected signal power threshold and/or the reflected-to-forward signal power ratio threshold), thus re-establishing an acceptable match and facilitating more optimal energy absorption by load 1224. For example, system controller 1208 may provide control signals over a control path 1244 to the variable impedance matching network 1214, which causes variable impedance matching network 1214 to vary inductive, capacitive, and/or resistive values of one or more components within the circuit, thus adjusting the impedance transformation provided by variable impedance matching network 1214.

Variable impedance matching network 1214 may have any of a variety of configurations. For example, variable impedance matching network 1214 may include any one or more circuits selected from an inductance/capacitance (LC) network, an inductance-only network, a capacitance-only network, or a combination of bandpass, high-pass and low-pass circuits, in various embodiments. In an embodiment in which the variable impedance matching network 1214 is implemented in a balanced portion of transmission path 1234, variable impedance matching network 1214 is a double-ended circuit with two inputs and two outputs. In an example, variable impedance matching network 1214 includes a variable capacitance network (e.g., double-ended network 1300, FIG. 13). However, variable impedance matching network 1214 may include both variable inductance and variable capacitance elements in alternative embodiments. The inductance, capacitance, and/or resistance values provided by variable impedance matching network 1214, which in turn affect the impedance transformation provided by the network 1214, are established through control signals from the system controller 1208. By changing the state of variable impedance matching network 1214 over the course of a treatment operation to dynamically match the ever-changing impedance of cavity 1204 plus load 1224 within cavity 124, the system efficiency may be maintained at a high level throughout the defrosting operation.

Figure 13:
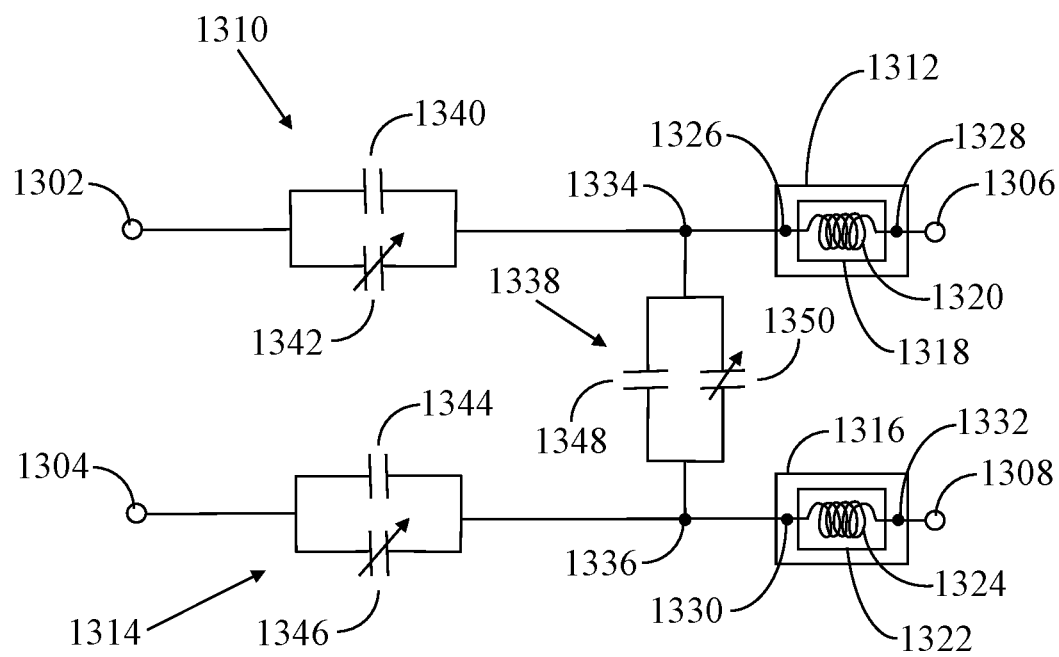
FIG. 13 shows a schematic diagram of double-ended variable impedance network with variable capacitances in accordance with another example.

FIG. 13 shows a schematic diagram of a double-ended variable impedance matching network 1300 (e.g., variable impedance matching network 1214, FIG. 12) with variable capacitance in accordance with an example. Double-ended variable impedance matching network 1300 may be incorporated in a defrosting system (e.g., defrosting system 800, 902, 904, 1200, FIGS. 8, 9, 12). Double-ended variable impedance matching network 1300 includes a network of fixed-value and variable passive components.

Network 1300 includes a double-ended input having a first input node 1302 and a second input node 1304 and a double-ended output having a first output node 1306 and a second output node 1308. When connected into system 1200 (FIG. 12), first input node 1302 may be connected to a first conductor of balanced conductor 1234-4, and second input node 1304 may be connected to a second conductor of balanced conductor 1234-4. Similarly, the first output node 1306 may be connected to a first conductor of balanced conductor 1234-5, and the second output node 1308 may be connected to a second conductor of balanced conductor 1234-5.

In the specific embodiment illustrated in FIG. 13, circuit 1300 includes a first variable component, in the form of a first capacitance network 1310, and a first inductor assembly 1312 coupled in series between first input and output nodes 1302, 1306. Circuit 1300 further includes a second variable component, in the form of a second capacitance network 1314, and a second inductor assembly 1316 connected in series between second input and output nodes 1304, 1308. First inductor assembly 1312 includes a first fixture element 1318 (e.g., any of fixture elements 102, 600, 700, FIGS. 1, 3, 6, 7) and a first helical inductor 1320 (e.g., helical inductor 112, FIGS. 1, 2) supported by first fixture element 1318. Similarly, second inductor assembly 1316 includes a second fixture element 1322 (e.g., any of fixture elements 102, 600, 700, FIGS. 1, 3, 6, 7) and a second helical inductor 1324 (e.g., helical inductor 112, FIGS. 1, 2) supported by second fixture element 1322.

First helical inductor 1320 has a first input end 1326 coupled to an output of first capacitance network 1310 and a first output end 1328 coupled to first output node 1302. Second helical inductor 1324 has a second input end 1330 coupled to an output of second capacitance network 1314 and a second output end 1332 coupled to second output node 1308.

First fixture element 1318 and first helical inductor 1320 of first inductor assembly 1312, as well as second fixture element 1322 and second helical inductor 1324 of second inductor assembly 1316 are shown in highly simplified form in the schematic diagram of FIG. 13. However, it should be understood that each of first and second fixture elements 1318, 1322 includes a central core and support structures coupled to and projecting outwardly from the central core, and the support structures have an outer edge with indentations extending toward the central core. Further, the support structures are spaced apart from one another about the central core by air gaps. Each of first and second helical inductors 1320, 1324 includes multiple turns which are seated in the indentations of the support structures. Additionally, first and second ends of the central cores are configured for attachment to a substrate (e.g., PCB 402, FIG. 4). Various details and embodiments of first and second fixture elements 1318, 1322 and first and second helical inductors 1320, 1324 are discussed above in connection with FIGS. 1-7, and are not repeated herein for brevity.

First and second helical inductors 1320, 1324 are relatively large in both size and inductance value, in an embodiment, as they may be designed for relatively low frequency (e.g., about 40.66 MHz to about 40.70 MHz) and high power (e.g., about 50 W to about 500 W) operation. For example, first and second inductors 1320, 1324 each may have a value in a range of about 100 nH to about 1000 nH (e.g., in a range of about 200 nH to about 600 nH), although their values may be lower and/or higher, in other embodiments. According to an embodiment, inductors 1320, 1324 are fixed-value, lumped air coil inductors. First and second fixture elements 1318, 1322 suitably support corresponding first and second helical inductors 1320, 1324 to enable inductance consistency and to enable secure attachment to a substrate (e.g., PCB 402, FIG. 4) to yield effective anti-vibration performance during operation.

A first intermediate node 1334 is positioned between first variable capacitance network 1310 and first inductor assembly 1312 and a second intermediate node 1336 is positioned between second variable capacitance network 1314 and second inductor assembly 1316. A third variable component, in the form of a third variable capacitance network 1338 is coupled between first and second intermediate nodes 1334, 1336, in an embodiment.

First and second variable capacitance networks 1310, 1314 correspond to "series matching portions" of the matching network 1300. According to an embodiment, first variable capacitance network 1301 includes a first fixed-value capacitor 1340 coupled in parallel with a first variable capacitor 1342. First fixed-value capacitor 1340 may have a capacitance value in a range of about 1 pF to about 100 pF, and first variable capacitor 1342 may include a network of capacitive components that may be selectively coupled together to provide capacitances in a range of 0 pF to about 100 pF. Similarly, second variable capacitance network 1314 includes a second fixed-value capacitor 1344 coupled in parallel with a second variable capacitor 1346. Second fixed-value capacitor 1344 may have a capacitance value in a range of about 1 pF to about 100 pF, and second variable capacitor 1346 may include a network of capacitive components that may be selectively coupled together to provide capacitances in a range of 0 pF to about 100 pF.

To ensure the balance of the signals provided to first and second output nodes 1306, 1308, the capacitance values of first and second variable capacitance networks 1310, 1314 are controlled to be substantially the same at any given time. For example, the capacitance values of the first and second variable capacitors 1342, 1346 may be controlled so that the capacitance values of first and second variable capacitance networks 1310, 1314 are substantially the same at any given time. First and second variable capacitors 1342, 1346 are operated in a paired manner, meaning that their capacitance values during operation are controlled, at any given time, to ensure that the RF signals conveyed to first and second output nodes 1306, 1308 are balanced. The capacitance values of the first and second fixed-value capacitors 1340, 1344 may be substantially the same, in some embodiments, although they may be different, in others.

The "shunt matching portion" of the variable impedance matching network 1300 is provided by third variable capacitance network 1338 and fixed first and second helical inductors 1320, 1324. In an example, third variable capacitance network 1338 includes a third fixed-value capacitor 1348 coupled in parallel with a third variable capacitor 1350. Third fixed-value capacitor 1348 may have a capacitance value in a range of about 1 pF to about 500 pF, and third variable capacitor 1350 may include a network of capacitive components that may be selectively coupled together to provide capacitances in a range of 0 pF to about 200 pF.

Because the states of the variable capacitance networks 1310, 1314, 1338 may be changed to provide multiple capacitance values, the variable capacitance networks 1310, 1314, 1338 are configurable to optimally match the impedance of the cavity plus load (e.g., cavity 1204 plus load 1224, FIG. 12) to the RF signal source (e.g., RF signal source 1210, FIG. 12). By varying the capacitance values of variable capacitors 1342, 1346, 1350 in matching network 1300, the system controller (e.g., system controller 1208, FIG. 12) may increase or decrease the impedance transformation provided by matching network 1300. Desirably, the capacitance value changes improve the overall impedance match between the RF signal source 1210 and the impedance of the cavity plus load, which should result in a reduction of the reflected signal power and/or the reflected-to-forward signal power ratio. In most cases, system controller 1208 may strive to configure the matching network 1300 in a state in which a maximum electromagnetic field intensity is achieved in defrosting cavity 1204, and/or a maximum quantity of power is absorbed by load 1224, and/or a minimum quantity of power is reflected by load 1224.

It should be understood that the variable impedance matching networks 1100, 1300 illustrated in FIGS. 11 and 13 are but two possible circuit configurations that may perform the desired single-ended and double-ended variable impedance transformations. Other embodiments of single-ended and double-ended variable impedance matching circuits may include differently arranged inductive or capacitive networks, or may include passive networks that include various combinations of inductors, capacitors, and/or resistors, where some of the passive components may be fixed-value components, and some of the passive components may be variable-value components (e.g., variable inductors, variable capacitors, and/or variable resistors). In any of these other embodiments, relatively large air coil helical inductors may be incorporated in inductor assemblies, each of which includes a fixture element, such as those described above, for supporting the helical inductors to enable inductance consistency and to enable secure attachment to a substrate (e.g., PCB 402, FIG. 4) to yield effective anti-vibration performance during operation.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

Embodiments disclosed herein entail an inductor assembly, an impedance matching network that includes the inductor assembly and a system that includes the impedance matching network with the inductor assembly. The system may be a defrosting (or thawing) system that implements one or more impedance matching networks. The inductor assembly includes a fixture element that supports a helical inductor having multiple turns. The fixture element includes multiple support structures surrounding a central core, and each support structure includes an outer edge having a notched profile of indentations. The turns of the helical inductor are seated in the indentations of the support structures. The indentations in the support structures are spread uniformly along the support structures to ensure that the gaps between each turn of the helical inductor are even. Further, the fixture element retains all of the turns of the helical inductors so that the turns cannot freely shift and the fixture can be directly attached to a substrate, such as a printed circuit board (PCB). Therefore, the fixture element may ensure the consistency of the inductance of the helical inductor and may additionally provide a firm support for the helical inductor to enable good anti-vibration performance.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An inductor assembly comprising:
a fixture element having a central core and first and second support structures coupled to and projecting outwardly from the central core, each of the first and second support structures having an outer edge with a notched profile of indentations extending toward the central core; and
a helical inductor having multiple turns, the turns being seated in the indentations of the first and second support structures;
wherein each of the support structures includes an opening extending through that support structure.

2. The inductor assembly of claim 1 wherein the first and second support structures are spaced apart from one another about the central core by air gaps.

3. The inductor assembly of claim 1 wherein each of the indentations in the first second support structures exhibits a first width parallel to a lengthwise dimension of the fixture element, the first width being the same for each of the indentations, and the first width corresponding to a second width of one of the turns of the helical inductor.

4. The inductor assembly of claim 1 wherein for each of the first and second support structures, the indentations are separated from one another by spacings, the spacings exhibiting a spacing width, and the spacing width being the same for each of the spacings.

5. The inductor assembly of claim 1 wherein:
the first support structure comprises a first set of the indentations extending toward the central core; and
the second support structure comprises a second set of the indentations extending toward the central core, wherein individual indentations of the second set of indentations are offset relative to a longitudinal dimension of the fixture element from individual indentations of the first set of indentations to accommodate the turns of the helical inductor.

6. The inductor assembly of claim 1, further comprising:
a third support structure; and
a fourth support structure, wherein the first, second, third, and fourth support structures are equidistantly spaced apart from one another about the central core, and the turns of the helical inductor are seated in the indentations of the first and second support structures, and in indentations in the third and fourth support structures.

7. The inductor assembly of claim 1, further comprising:
a third support structure, wherein the first, second, and third support structures are equidistantly spaced apart from one another about the central core, and the turns of the helical inductor are seated in the indentations of the first, second, and third support structures.

8. The inductor assembly of claim 1 wherein the central core exhibits a first length, and each of the support structures exhibits a second length, the first length being greater than the second length such that first and second ends of the central core extend longitudinally beyond corresponding ends of the support structures, the first and second ends of the central core being configured for attachment to a substrate.

9. The inductor assembly of claim 1 wherein the fixture element is formed from a thermostable material having a thermal stability greater than two hundred degrees Celsius.

10. An impedance matching network comprising:
a first input node;
a first output node; and
a first variable impedance component and a first inductor assembly coupled in series between the first input node and the first output node, a value of the first variable impedance component being adjustable to affect an impedance transformation provided by the impedance matching network, and the first inductor assembly comprising:
a fixture element having a central core and support structures coupled to and projecting outwardly from the central core, each of the support structures having an outer edge with a notched profile of indentations extending toward the central core; and
a helical inductor having multiple turns, the turns being seated in the indentations of the support structures, the helical inductor having an input end coupled to an output of the first variable impedance component and having an output end coupled to the first output node.

11. The impedance matching network of claim 10 wherein the first variable impedance component comprises a first variable capacitor.

12. The impedance matching network of claim 10 wherein the support structures are spaced apart from one another about the central core by air gaps.

13. The impedance matching network of claim 10 wherein the central core of the fixture element exhibits a first length, and each of the support structures exhibits a second length, the first length being greater than the second length such that first and second ends of the central core extend longitudinally beyond corresponding ends of the support structures, the first and second ends of the central core being configured for attachment to a substrate.

14. The impedance matching network of claim 10 further comprising:
an intermediate node between the first variable impedance component and the first inductor assembly; and
a second variable impedance component coupled between the intermediate node and a ground reference terminal.

15. The impedance matching network of claim 10 further comprising:
   a first intermediate node between the first variable impedance component and the first inductor assembly;
   a second input node;
   a second output node;
   a second variable impedance component and a second inductor assembly coupled in series between the second input node and the second output node, a second value of the second variable impedance component being adjustable to affect the impedance transformation provided by the impedance matching network, and the second inductor assembly comprising:
   a second fixture element having a second central core and second support structures coupled to and projecting outwardly from the second central core, each of the second support structures having a second outer edge with a second notched profile of indentations extending toward the second central core; and
   a second helical inductor having multiple second turns, the second turns being seated in the indentations of the second support structures, the second helical inductor having a second input end coupled to a second output of the second variable impedance component and having a second output end coupled to the second output node;
   a second intermediate node between the second variable impedance component and the second inductor assembly; and
   a third variable impedance component coupled between the first and second intermediate nodes.

16. A thermal increase system coupled to a cavity configured to contain a load, the thermal increase system comprising:
   a radio frequency (RF) signal source configured to supply an RF signal;
   a transmission path electrically coupled between the RF signal source and first and second electrodes that are positioned across the cavity; and
   an impedance matching network electrically coupled along the transmission path, wherein the impedance matching network comprises:
   a first input node;
   a first output node; and
   a first variable impedance component and a first inductor assembly coupled in series between the first input node and the first output node, a value of the first variable impedance component being adjustable to affect an impedance transformation provided by the impedance matching network, and the first inductor assembly comprising:
   a fixture element having a central core and support structures coupled to and projecting outwardly from the central core, each of the support structures having an outer edge with a notched profile of indentations extending toward the central core; and
   a helical inductor having multiple turns, the turns being seated in the indentations of the support structures, the helical inductor having an input end coupled to an output of the first variable impedance component and having an output end coupled to the first output node.

17. The thermal increase system of claim 16 wherein the support structures are spaced apart from one another about the central core by air gaps.

18. The thermal increase system of claim 16 wherein each of the indentations exhibits a first width parallel to a lengthwise dimension of the fixture element, the first width being the same for each of the indentations, and the first width corresponding to a second width of the helical inductor.

19. The thermal increase system of claim 16 wherein the support structures comprise:
   a first support structure having a first set of the indentations extending toward the central core; and
   a second support structure having a second set of the indentations extending toward the central core, wherein individual indentations of the second set of indentations are offset in a longitudinal direction relative to the helical inductor from individual indentations of the first set of indentations to accommodate the turns of the helical inductor.

* * * * *